United States Patent
Muraki

(10) Patent No.: US 6,337,485 B1
(45) Date of Patent: Jan. 8, 2002

(54) ELECTRON BEAM EXPOSURE APPARATUS AND ITS CONTROL METHOD

(75) Inventor: Masato Muraki, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/629,893

(22) Filed: Jul. 31, 2000

Related U.S. Application Data

(62) Division of application No. 09/082,324, filed on May 21, 1998, now Pat. No. 6,107,136.

(30) Foreign Application Priority Data

| May 22, 1997 | (JP) | ................................................ 9-132244 |
| May 22, 1997 | (JP) | ................................................ 9-132245 |
| May 22, 1997 | (JP) | ................................................ 9-132259 |
| Jul. 2, 1997 | (JP) | ................................................ 9-176925 |

(51) Int. Cl.[7] .......................... H01J 37/30; H01J 37/304
(52) U.S. Cl. ..................................... 250/492.2; 250/398
(58) Field of Search ............................. 250/492.2, 398, 250/396 R, 492.21

(56) References Cited

U.S. PATENT DOCUMENTS

| 3,778,626 A | * 12/1973 | Robertson | ............... 250/492.21 |
| 4,145,615 A | 3/1979 | Sumi | ....................... 250/492 A |
| 4,546,260 A | 10/1985 | Simpson et al. | ......... 250/491.1 |
| 4,692,579 A | 9/1987 | Saitou et al. | ............. 250/492.2 |
| 4,891,524 A | * 1/1990 | Yasuda et al. | ............... 250/398 |
| 4,974,919 A | 12/1990 | Muraki et al. | ................ 350/6.6 |
| 4,982,099 A | 1/1991 | Lischke | .................... 250/492.2 |
| 5,153,773 A | 10/1992 | Muraki et al. | ............... 359/619 |
| 5,345,292 A | 9/1994 | Shiozawa et al. | .............. 355/67 |
| 5,363,170 A | 11/1994 | Muraki | ......................... 355/67 |
| 5,463,497 A | 10/1995 | Muraki et al. | .............. 359/618 |
| 5,483,073 A | 1/1996 | Benner | ......................... 250/311 |
| 5,834,783 A | 11/1998 | Muraki et al. | ............... 250/398 |

* cited by examiner

Primary Examiner—Bruce Anderson
(74) Attorney, Agent, or Firm—Fitzpatrick, Cella, Harper & Scinto

(57) ABSTRACT

An electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes divided exposure fields obtained by dividing an exposure pattern in a moving direction of the stage while continuously moving the object to be exposed by the stage. The apparatus includes a deflection width adjustment unit for dynamically adjusting a minimum deflection width of the deflector in correspondence with the fields to be exposed of the exposure pattern and a moving velocity adjustment unit for dynamically adjusting moving velocities of the stage in units of divided exposure fields in correspondence with exposure times required for exposing the respective divided exposure fields while deflecting the plurality of electron beams by the deflector.

15 Claims, 27 Drawing Sheets

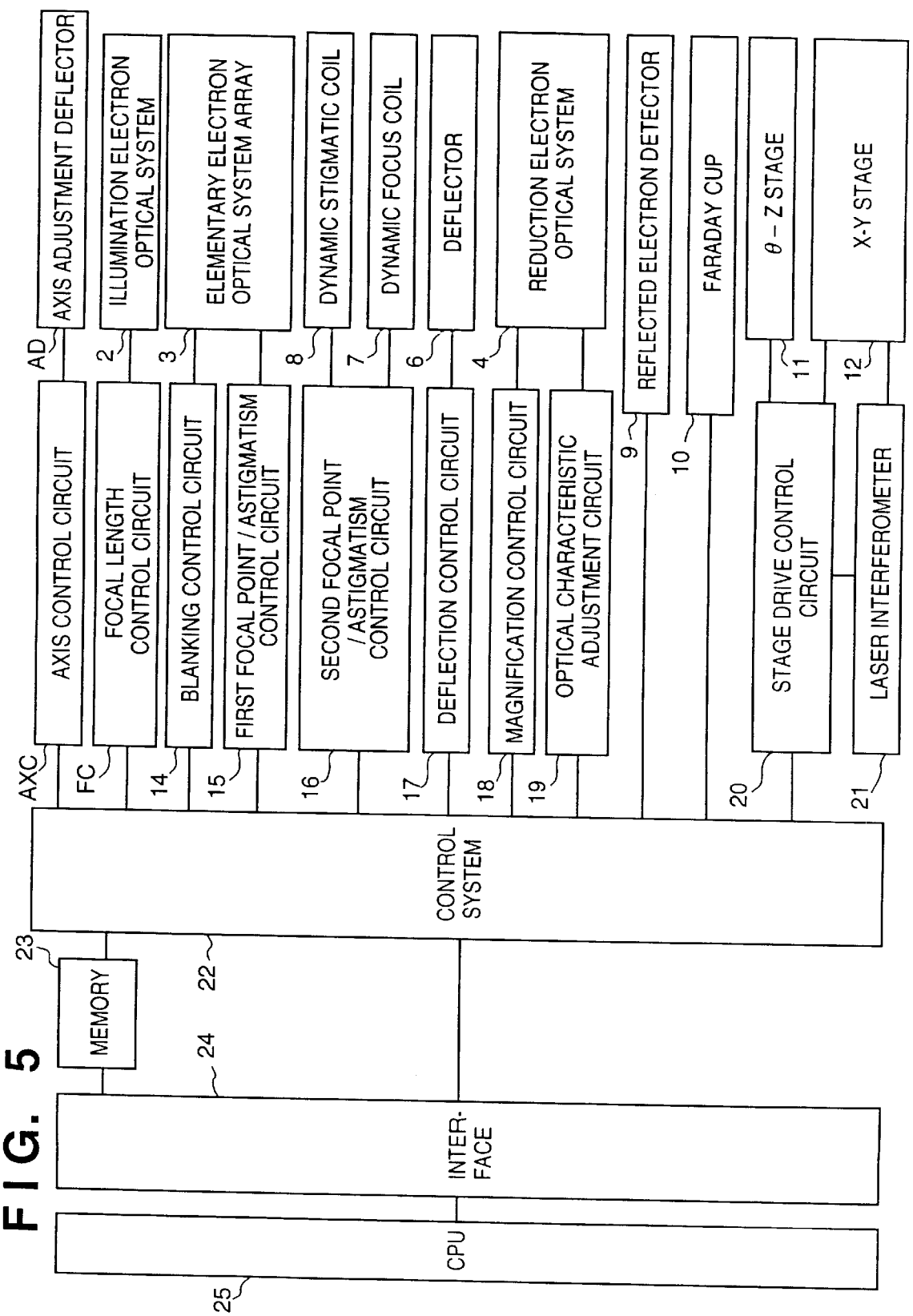

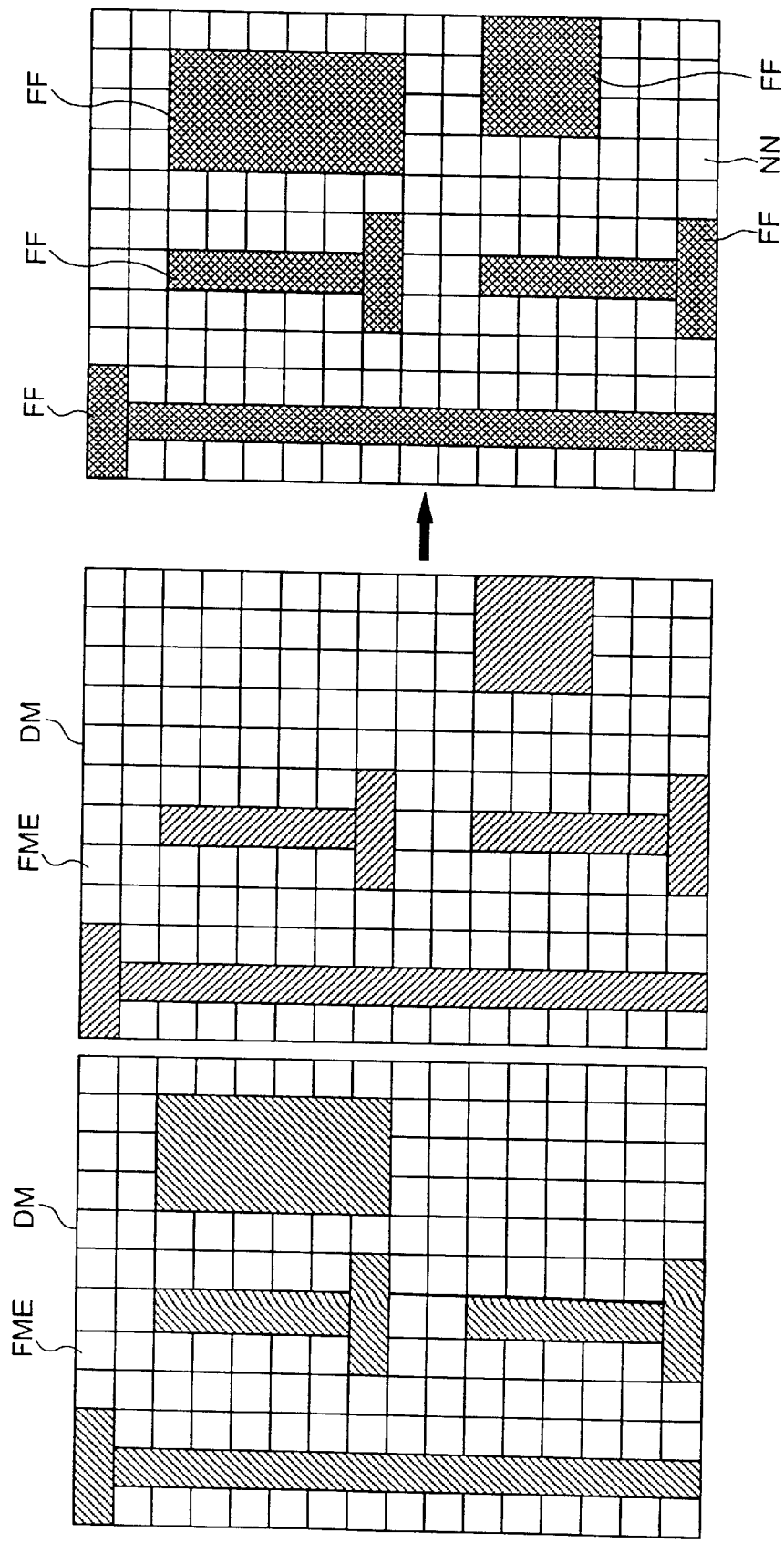

FIG. 11

| SUBFIELD No. | REFERENCE POSITION | MINIMUM DEFLECTION WIDTH | BEAM DIAMETER | MATRIX No. | BLANKING CONTROL | | | | |
|---|---|---|---|---|---|---|---|---|---|
| | | | | | A(1,1) | A(1,2) | A(1,3) | ... | E(3,9) |
| 1 | x(1), y(1) | def(1) | W(1) | 1 | on or off | on or off | on or off | ... | on or off |
| | | | | 2 | on or off | on or off | on or off | ... | on or off |
| | | | | ... | ... | ... | ... | ... | ... |
| | | | | m(1) | on or off | on or off | on or off | ... | on or off |
| 2 | x(2), y(2) | def(2) | W(2) | 1 | on or off | on or off | on or off | ... | on or off |
| | | | | 2 | on or off | on or off | on or off | ... | on or off |
| | | | | ... | ... | ... | ... | ... | ... |
| | | | | m(2) | on or off | on or off | on or off | ... | on or off |
| ... | ... | ... | ... | ... | ... | ... | ... | ... | ... |
| n | x(n), y(n) | def(n) | W(n) | 1 | on or off | on or off | on or off | ... | on or off |
| | | | | 2 | on or off | on or off | on or off | ... | on or off |
| | | | | ... | ... | ... | ... | ... | ... |
| | | | | m(n) | on or off | on or off | on or off | ... | on or off |

SEMICONDUCTOR DEVICE MANUFACTURING FLOW

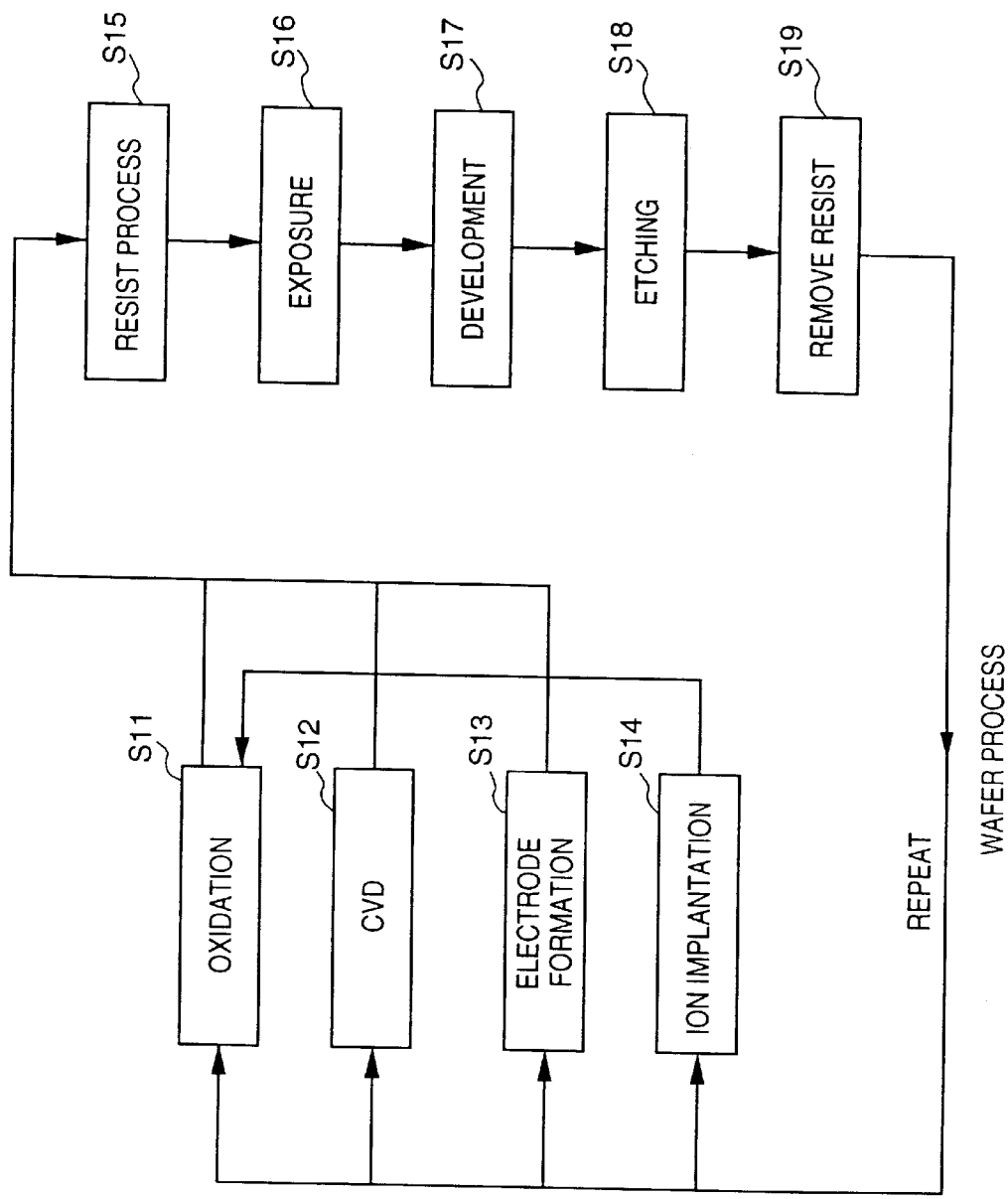

FIG. 17

| SUBFIELD No. | REFERENCE POSITION | MINIMUM DEFLECTION WIDTH | BEAM DIAMETER | MATRIX No. | BLANKING CONTROL ||||
|---|---|---|---|---|---|---|---|---|
| | | | | | A(1,1) | A(1,2) | A(1,3) ... | E(3,9) |
| 1 | x(1), y(1) | def(1) | Td(1) | 1 | on or off | on or off | on or off ... | on or off |
| | | | | 2 | on or off | on or off | on or off ... | on or off |
| | | | | ... | ... | ... | ... | ... |
| | | | | m(1) | on or off | on or off | on or off ... | on or off |
| 2 | x(2), y(2) | def(2) | Td(2) | 1 | on or off | on or off | on or off ... | on or off |
| | | | | 2 | on or off | on or off | on or off ... | on or off |
| | | | | ... | ... | ... | ... | ... |
| | | | | m(2) | on or off | on or off | on or off ... | on or off |
| ... | ... | ... | ... | ... | ... | ... | ... | ... |
| n | x(n), y(n) | def(n) | Td(n) | 1 | on or off | on or off | ... | on or off |
| | | | | 2 | on or off | on or off | ... | on or off |
| | | | | ... | ... | ... | ... | ... |
| | | | | m(n) | on or off | on or off | ... | on or off |

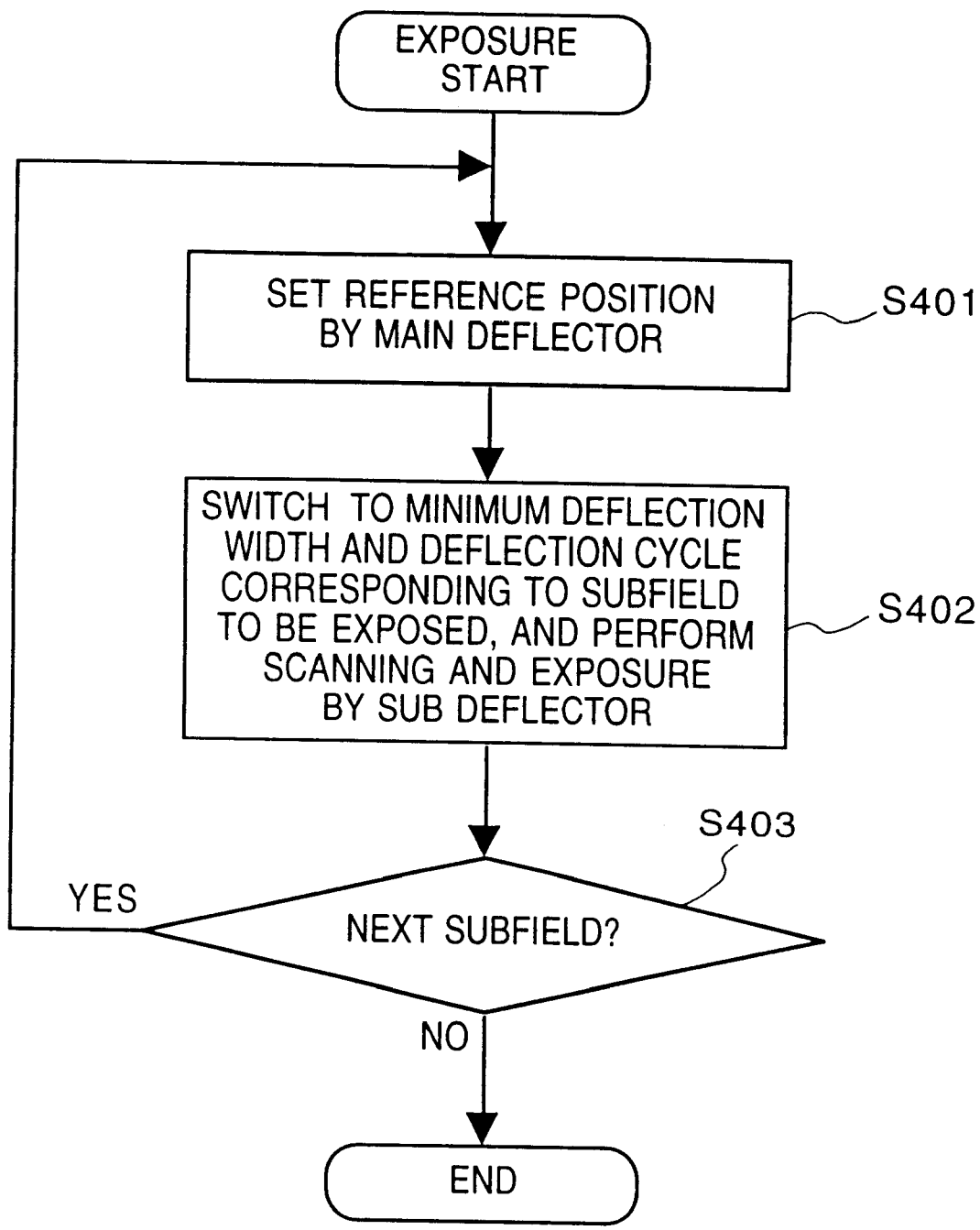

FIG. 24

[CONTENTS OF EXPOSURE CONTROL DATA]

| MAIN FIELD No. | STAGE VELOCITY | EXPOSURE CONTROL DATA FOR EACH SUBFIELD | | | |
|---|---|---|---|---|---|
| 1 | V(1) | SFD(1, 1) | SFD(1, 2) | ...... | SFD(1, 16) |
| 2 | V(2) | SFD(2, 1) | SFD(2, 2) | ...... | SFD(2, 16) |
| ... | ... | ... | ... | ... | ... |

[CONTENTS OF EXPOSURE CONTROL DATA SFD FOR EACH SUBFIELD]

| SUBFIELD No. | REFERENCE POSITION | DEFLECTION WIDTH | MINIMUM BEAM DIAMETER | DEFLECTION CYCLE | MATRIX No. | BLANKING CONTROL | | | | |
|---|---|---|---|---|---|---|---|---|---|---|
| | | | | | | A(1, 1) | A(1, 2) | A(1, 3) | ... | E(3, 9) |
| 1 | x(n), y(n) | def(n) | W(n) | Td(n) | m(1) | on or off | on or off | on or off | ... | on or off |
| | | | | | m(2) | on or off | on or off | on or off | ... | on or off |
| | | | | | ... | ... | ... | ... | ... | ... |
| | | | | | m(n) | on or off | on or off | on or off | ...... | on or off |

ELECTRON BEAM EXPOSURE APPARATUS AND ITS CONTROL METHOD

This application is a divisional of application Ser. No. 09/082,324, filed May 21, 1998, now U.S. Pat. No. 6,107,636.

BACKGROUND OF THE INVENTION

1. Field of the Invention

The present invention relates to an electron beam exposure apparatus and, more particularly, to an electron beam exposure apparatus for drawing a pattern on a wafer or drawing a pattern on a mask or reticle using a plurality of electron beams, and its control method.

2. Description of the Related Art

An electron beam exposure apparatus includes a point beam type apparatus which uses a beam shaped in a spot pattern, a variable rectangular beam type apparatus which uses a beam shaped to have a rectangular section with a variable size, a stencil mask type apparatus which shapes a beam into a desired sectional shape using a stencil, and the like.

The point beam type electron beam exposure apparatus is used for only research purposes due to its low throughput. The variable rectangular beam type electron beam exposure apparatus has a throughput higher by one or two orders of magnitude than that of the point beam type, but suffers problems in terms of throughput when highly integrated patterns having a line width as small as about 0.1 μm are to be formed by exposure. On the other hand, the stencil mask type electron beam exposure apparatus uses a stencil mask formed with a plurality of repetitive pattern through holes in a portion corresponding to a variable rectangular aperture. Hence, the stencil mask type electron beam exposure apparatus is effective for exposure of repetitive patterns. However, when a semiconductor circuit requires a large number of transfer patterns that cannot be formed on a single stencil mask, a plurality of stencil masks must be prepared in advance, and must be used one by one, resulting in a long mask exchange time and a considerable throughput drop.

As an apparatus that can solve the above problems, a multi-electron beam type exposure apparatus is known. In this apparatus, a plurality of electron beams are irradiated on the sample surface along the course of design coordinate positions, and are deflected along that course of design coordinate positions to scan the sample surface. In addition, the plurality of electron beams are individually ON/OFF-controlled in correspondence with the pattern to be drawn, thereby drawing the pattern. Since the multi-electron beam type exposure apparatus can draw an arbitrary pattern, it can improve the throughput.

FIG. 15A schematically shows the multi-electron beam type exposure apparatus. Reference numerals 501a, 501b, and 501c denote electron guns that can individually ON/OFF-control electron beams. Reference numeral 502 denotes a reduction electron optical system for projecting a plurality of electron beams emitted by the electron guns 501a, 501b, and 501c onto a wafer 503 in a reduced scale; and 504, a deflector for deflecting the plurality of electron beams to be projected onto the wafer 503 in the reduced scale.

The plurality of electron beams coming from the electron guns 501a, 501b, and 501c are deflected by an identical amount by the deflector 504. With this deflection, the respective electron beams are deflected while sequentially settling their positions on the wafer in accordance with a matrix having a matrix spacing defined by the minimum deflection width of the deflector 504 with reference to their beam reference positions. The individual electron beams form exposure patterns on different exposure regions by exposure.

FIGS. 15B to 15D show the state wherein the electron beams coming from the electron guns 501a, 501b, and 501c expose the corresponding exposure regions to form exposure patterns in accordance with an identical matrix. The respective electron beams move while settling their positions on the matrix at the same time like (1, 1), (1, 2), . . . , (1, 16), (2, 1), (2, 2), . . . , (2, 16), (3, 1), . . . , and expose the corresponding regions to form patterns (P1, P2, P3) by turning on the beams at the positions of the exposure patterns (P1, P2, P3).

In the multi-electron beam type exposure apparatus, since the respective beams simultaneously form different patterns, the size of each electron beam and the minimum deflection width of the deflector 504 corresponding to that size are set in correspondence with the minimum line width of the exposure patterns. As the minimum line width becomes smaller, the number of times of exposure while settling the electron beam positions increases, resulting in a considerable throughput drop.

The exposure patterns do not always equally include patterns with a minimum line width. However, conventionally, even in a region defined by a pattern having a line width larger than the minimum line width, exposure is done using the electron beam size and the minimum deflection width corresponding to that size, determined based on the minimum line width in all the patterns. For this reason, the throughput drops as the minimum line width of the pattern shrinks.

SUMMARY OF THE INVENTION

It is an object of the present invention to achieve high throughput by dynamically changing the dot pattern size to be formed on the object to be exposed upon forming a single pattern by exposure.

An electron beam exposure apparatus according to one aspect of the present invention is an electron beam exposure apparatus for drawing a pattern on an object to be exposed using a plurality of electron beams, comprising an electron source for emitting electrons, a plurality of elementary electron optical systems for respectively forming intermediate images of the electron source, a projection electron optical system for projecting the plurality of intermediate images onto the object to be exposed and an adjustment unit for dynamically adjusting sizes of dot patterns formed on the object to be exposed upon projection of the intermediate images in correspondence with fields to be exposed of the pattern to be drawn by exposure on the object to be exposed.

In the electron beam exposure apparatus, the adjustment unit dynamically adjusts the sizes of the intermediate images to be projected onto the object to be exposed, thereby dynamically adjusting the sizes of the dot patterns to be formed on the object to be exposed.

The electron beam exposure apparatus further comprises an illumination electron optical system which is inserted between the electron source and the plurality of elementary electron optical systems, and is adapted to convert the electrons emitted by the electron source into substantially collimated electron beams, and to irradiate the electron beams onto the plurality of elementary electron optical systems, and wherein the adjustment unit adjusts the focal length of the illumination electron optical system to adjust the sizes of the intermediate images to be projected onto the object to be exposed.

In the electron beam exposure apparatus, the adjustment unit adjusts the focal length of the illumination optical system while fixing a focal point position of the illumination electron optical system on the electron source side.

In the electron beam exposure apparatus, the illumination electron optical system comprises a plurality of electron lenses disposed in an optical axis direction, and the adjustment unit adjusts the focal length of the illumination electron optical system while fixing the focal point position of the illumination electron optical system on the electron source side, by changing focal lengths of at least two of the plurality of electron lenses.

The electron beam exposure apparatus further comprises an axis correction unit for correcting position deviations of the intermediate images to be projected onto the object to be exposed produced when the adjustment unit adjusts the focal length of the illumination electron optical system.

In the electron beam exposure apparatus, the axis correction unit corrects the position deviations of the intermediate images of the electron source to be projected onto the object to be exposed by correcting positions of the plurality of intermediate images formed immediately below the plurality of elementary electron optical systems.

The electron beam exposure apparatus further comprises a scanning unit for scanning the intermediate images to be projected onto the object to be exposed, and wherein the adjustment unit dynamically adjusts a minimum scanning width of the scanning unit in correspondence with the sizes of the dot patterns to be formed on the object to be exposed.

In the electron beam exposure apparatus, the scanning unit comprises a deflector for deflecting electron beams to be irradiated from the plurality of elementary electron optical systems onto the object to be exposed, and the adjustment unit dynamically adjusts a minimum deflection width of the deflector in correspondence with the sizes of the dot patterns to be formed on the object to be exposed.

In the electron beam exposure apparatus, the adjustment unit dynamically adjusts a scanning cycle of the scanning unit in correspondence with the minimum scanning width of the scanning unit.

In the electron beam exposure apparatus, the adjustment unit dynamically adjusts a deflection cycle of the scanning unit in correspondence with the minimum deflection width of the deflector.

In the electron beam exposure apparatus, the plurality of elementary electron optical systems have a function of correcting any aberrations produced upon projecting the plurality of intermediate images formed by the plurality of elementary electron optical systems onto the object to be exposed via the projection electron optical system.

In the electron beam exposure apparatus, the adjustment unit dynamically adjusts the sizes of the dot patterns to be formed on the object to be exposed by projecting the intermediate images in accordance with a unit exposure field to be exposed of the entire field of the pattern to be drawn by exposure on the object to be exposed, the entire field being made up of a set of a plurality of unit exposure fields.

In the electron beam exposure apparatus, the adjustment unit adjusts the sizes of the dot patterns to be formed on the object to be exposed by projecting the intermediate images in units of unit exposure fields on the basis of a feature of an exposure pattern in the corresponding unit exposure field.

In the electron beam exposure apparatus, the adjustment unit adjusts the sizes of the dot patterns to be formed on the object to be exposed by projecting the intermediate images in units of unit exposure fields on the basis of a minimum line width of an exposure pattern in the corresponding unit exposure field.

According to another aspect of the present invention, an electron beam exposure apparatus for drawing a pattern on an object to be exposed using a plurality of electron beams, comprises an electron source for emitting electrons, a projection electron optical system for projecting an image of the electron source onto the object to be exposed, and an adjustment unit for dynamically adjusting a size of a dot pattern formed on the object to be exposed upon projection of the image of the electron source in correspondence with fields to be exposed of the pattern to be drawn by exposure on the object to be exposed.

According to still another aspect of the present invention, a method of controlling an electron beam exposure apparatus, which has an electron source for emitting electrons, a plurality of elementary electron optical systems for respectively forming intermediate images of the electron source, and a projection electron optical system for projecting the plurality of intermediate images onto the object to be exposed, comprises the step of dynamically adjusting sizes of dot patterns formed on the object to be exposed upon projection of the intermediate.images in correspondence with fields to be exposed of a pattern to be drawn by exposure on the object to be exposed.

According to still another aspect of the present invention, a method of controlling an electron beam exposure apparatus, which has an electron source for emitting electrons, and a projection electron optical system for projecting an image of the electron source onto the object to be exposed, comprises the step of dynamically adjusting a size of a dot pattern formed on the object to be exposed upon projection of the image of the electron source in correspondence with fields to be exposed of a pattern to be drawn by exposure on the object to be exposed.

According to still another aspect of the present invention, a method of generating exposure control data used for controlling an electron beam exposure apparatus, which has an electron source for emitting electrons, a plurality of elementary electron optical systems for respectively forming intermediate images of the electron source, and a projection electron optical system for projecting the plurality of intermediate images onto the object to be exposed, comprises the steps of dividing a pattern to be drawn by exposure on the object to be exposed into a plurality of blocks, detecting features of patterns in the blocks, determining sizes of dot patterns to be formed on the object to be exposed by projecting the intermediate images in units of blocks on the basis of the features of the patterns in the blocks, and generating exposure control data on the basis of the determination result.

It is another object of the present invention to achieve high throughput by dynamically changing the minimum scanning width for scanning an intermediate image on the object to be exposed upon forming a single pattern by exposure.

An electron beam exposure apparatus according to one aspect of the present invention is an electron beam exposure apparatus for drawing a pattern on an object to be exposed using a plurality of electron beams, comprising an electron source for emitting electrons, a plurality of elementary electron optical systems for respectively forming intermediate images of the electron source, a projection electron optical system for projecting the plurality of intermediate images onto the object to be exposed, a scanning unit for scanning the plurality of intermediate images to be projected onto the object to be exposed, and an adjustment unit for dynamically adjusting a minimum scanning width of the scanning unit in correspondence with fields to be exposed of the pattern to be drawn by exposure on the object to be exposed.

In the electron beam exposure apparatus, the scanning unit comprises a deflector, and the adjustment unit dynamically adjusts a minimum deflection width of the deflector in correspondence with the fields to be exposed of the pattern to be drawn by exposure on the object to be exposed.

In the electron beam exposure apparatus, the adjustment unit dynamically adjusts the minimum scanning width of the scanning unit in accordance with a unit exposure field to be exposed of the entire field of the pattern to be drawn by exposure on the object to be exposed, the entire field being made up of a set of a plurality of unit exposure fields.

In the electron beam exposure apparatus, the adjustment unit adjusts the minimum scanning width of the scanning unit, to a minimum scanning width determined based on a minimum line width of an exposure pattern in the corresponding unit exposure field, in units of unit exposure fields.

In the electron beam exposure apparatus, the adjustment unit controls the scanning unit to scan electron beams without settling the electron beams in correspondence with a field, where none of the intermediate images are projected, i.e., no electron beams are irradiated onto the object to be exposed, of exposure fields of the object to be exposed.

In the electron beam exposure apparatus, the adjustment unit dynamically adjusts a scanning cycle of the scanning unit in correspondence with the minimum scanning width of the scanning unit.

In the electron beam exposure apparatus, the adjustment unit adjusts a deflection cycle of the deflector in correspondence with the minimum deflection width of the deflector.

In the electron beam exposure apparatus, the adjustment unit dynamically adjusts the sizes of the intermediate images to be projected onto the object to be exposed in correspondence with the minimum scanning width of the scanning unit.

The electron beam exposure apparatus further comprises an illumination electron optical system which is inserted between the electron source and the plurality of elementary electron optical systems, and is adapted to convert the electrons emitted by the electron source into substantially collimated electron beams, and to irradiate the electron beams onto the plurality of elementary electron optical systems, and wherein the adjustment unit dynamically adjusts the sizes of the intermediate images to be projected onto the object to be exposed by adjusting a focal length of the illumination electron optical system.

In the electron beam exposure apparatus, the deflector comprises first and second deflectors, the first deflector scans the intermediate images to be projected onto the object to be exposed within an elementary exposure field so as to expose a subfield made up of a set of elementary exposure fields, and the second deflector switches the subfield to be exposed every time exposure of the subfield is complete.

In the electron beam exposure apparatus, the first deflector comprises an electrostatic type deflector, and the second deflector comprises an electromagnetic type deflector.

According to the another aspect of the present invention, a method of controlling an electron beam exposure apparatus, which has an electron source for emitting electrons, a plurality of elementary electron optical systems for respectively forming intermediate images of the electron source, a projection electron optical system for projecting the plurality of intermediate images onto the object to be exposed, and a scanning unit for scanning the plurality of intermediate images to be projected onto the object to be exposed, comprises the step of dynamically adjusting a minimum scanning width of the scanning unit in correspondence with fields to be exposed of a pattern to be drawn by exposure on the object to be exposed.

According to still another aspect of the present invention, a method of controlling an electron beam exposure apparatus, which has an electron source for emitting electrons, a projection electron optical system for projecting an image of the electron source onto the object to be exposed, and a scanning unit for scanning the image of the electron source to be projected onto the object to be exposed, comprises the step of dynamically adjusting a minimum scanning width of the scanning unit in correspondence with fields to be exposed of a pattern to be drawn by exposure on the object to be exposed.

According to still another aspect of the present invention, a method of generating exposure control data used for controlling an electron beam exposure apparatus, which has an electron source for emitting electrons, a plurality of elementary electron optical systems for respectively forming intermediate images of the electron source, a projection electron optical system for projecting the plurality of intermediate images onto the object to be exposed, and a scanning unit for scanning the plurality of intermediate images to be projected onto the object to be exposed, comprises the steps of dividing a pattern to be drawn by exposure on the object to be exposed into a plurality of blocks, detecting features of patterns in the blocks, determining minimum scanning widths of the scanning unit in units of blocks on the basis of the features of the patterns in the blocks, and generating exposure control data on the basis of the determination result.

It is still another object of the present invention to achieve high throughput by dynamically changing the deflection width of an electron beam and the moving velocity of a stage upon forming a single pattern by exposure.

An electron beam exposure apparatus according to one aspect of the present invention is an electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes divided exposure fields obtained by dividing an exposure pattern in a moving direction of the stage while continuously moving the object to be exposed by the stage, comprising a deflection width adjustment unit for dynamically adjusting a minimum deflection width of the deflector in correspondence with the fields to be exposed of the exposure pattern, and a moving velocity adjustment unit for dynamically adjusting moving velocities of the stage in units of divided exposure fields in correspondence with exposure times required for exposing the respective divided exposure fields while deflecting the plurality of electron beams by the deflector.

In the electron beam exposure apparatus, the moving velocity adjustment unit adjusts the moving velocities of the stage in units of divided exposure fields so as to make the stage move by a length of the corresponding divided exposure field in the moving direction of the stage within the exposure time of the divided exposure field.

In the electron beam exposure apparatus, each of the divided exposure fields is made up of at least one unit exposure field formed by a matrix of a plurality of elementary exposure fields each of which is exposed by one electron beam, and the deflection width adjustment unit adjusts the minimum deflection width of the deflector in units of unit exposure fields.

In the electron beam exposure apparatus, each of the divided exposure fields is made up of a matrix of a plurality of unit exposure fields in directions perpendicular to the moving direction of the stage.

In the electron beam exposure apparatus, the deflection width adjustment unit adjusts the minimum deflection width of the deflector in units of unit exposure fields on the basis of a feature of an exposure pattern in the corresponding unit exposure region.

In the electron beam exposure apparatus, the deflection width adjustment unit adjusts the minimum deflection width of the deflector in units of unit exposure fields on the basis of a minimum line width of an exposure pattern in the corresponding unit exposure region.

The electron beam exposure apparatus further comprises an adjustment unit for adjusting sizes of the electron beams on the object to be exposed in correspondence with the minimum deflection width of the deflector.

In the electron beam exposure apparatus, the exposure time for each unit divided exposure field is determined on the basis of the number of times of settlement, a settling wait time, and a settling time of the electron beam in the corresponding divided exposure field.

In the electron beam exposure apparatus, the moving velocity adjustment unit adjusts the moving velocities of the stages in units of divided exposure fields to fall within a range in which a difference between the moving velocity of the stage upon exposing one divided exposure field, and the moving velocity of the stage upon exposing the neighboring divided exposure field of the one divided exposure field becomes not more than a predetermined value.

According to another aspect of the present invention, an electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes frames obtained by dividing an exposure pattern along a moving direction of the stage while continuously moving the object to be exposed by the stage, comprises a deflection width adjustment unit for dynamically adjusting a minimum deflection width of the deflector in correspondence with fields to be exposed of the exposure pattern, and a moving velocity adjustment unit for adjusting moving velocities of the stage in units of frames.

According to still another aspect of the present invention, a method of controlling an electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes divided exposure fields obtained by dividing an exposure pattern in a moving direction of the stage while continuously moving the object to be exposed by the stage, comprises the deflection width adjustment step of dynamically adjusting a minimum deflection width of the deflector in correspondence with the fields to be exposed of the exposure pattern, and the moving velocity adjustment step of dynamically adjusting moving velocities of the stage in units of divided exposure fields in correspondence with exposure times required for exposing the respective divided exposure fields while deflecting the plurality of electron beams by the deflector.

According to still another aspect of the present invention, a method of controlling an electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes frames obtained by dividing an exposure pattern along a moving direction of the stage while continuously moving the object to be exposed by the stage, comprises the deflection width adjustment step of dynamically adjusting a minimum deflection width of the deflector in correspondence with fields to be exposed of the exposure pattern, and the moving velocity adjustment step of adjusting moving velocities of the stage in units of frames.

According to still another aspect of the present invention, a method of generating exposure control data used for controlling an electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes divided exposure fields obtained by dividing an exposure pattern in a moving direction of the stage while continuously moving the object to be exposed by the stage, comprises the steps of dividing the exposure pattern into a plurality of blocks, detecting features of exposure patterns in the blocks, determining minimum deflection widths of the deflector in units of blocks on the basis of the features of the exposure patterns in the blocks, calculating exposure times required for exposing individual divided exposure fields, each of which includes at least one block, while deflecting the plurality of electron beams by the deflector, on the basis of the minimum deflection widths and shapes of the exposure patterns pertaining to the respective blocks, determining moving velocities of the stages in units of divided exposure fields in accordance with the calculated exposure times of the individual divided exposure fields, and generating exposure control data on the basis of the determined minimum deflection widths and moving velocities.

Further objects, features and advantages of the present invention will become apparent from the following detailed description of embodiments of the present invention with reference to the accompanying drawings.

BRIEF DESCRIPTION OF THE DRAWINGS

FIG. 5 is a block diagram for explaining the system arrangement according to the present invention;

FIGS. 10A to 10C are views for explaining the process of determining the exposure patterns to be drawn by the respective elementary electron optical systems and the matrix regions defined by a deflector;

FIG. 11 is a view for explaining exposure control data;

FIG. 14 is a flow chart for explaining the wafer process;

FIG. 17 is a view for explaining the exposure control data;

FIG. 18 is a flow chart for explaining exposure based on the exposure control data;

FIG. 24 is a view for explaining the exposure control data;

DETAILED DESCRIPTION OF THE PREFERRED EMBODIMENTS

[First Embodiment]

(Explanation of Constituting Elements of Electron Beam Exposure Apparatus)

Figure 1:
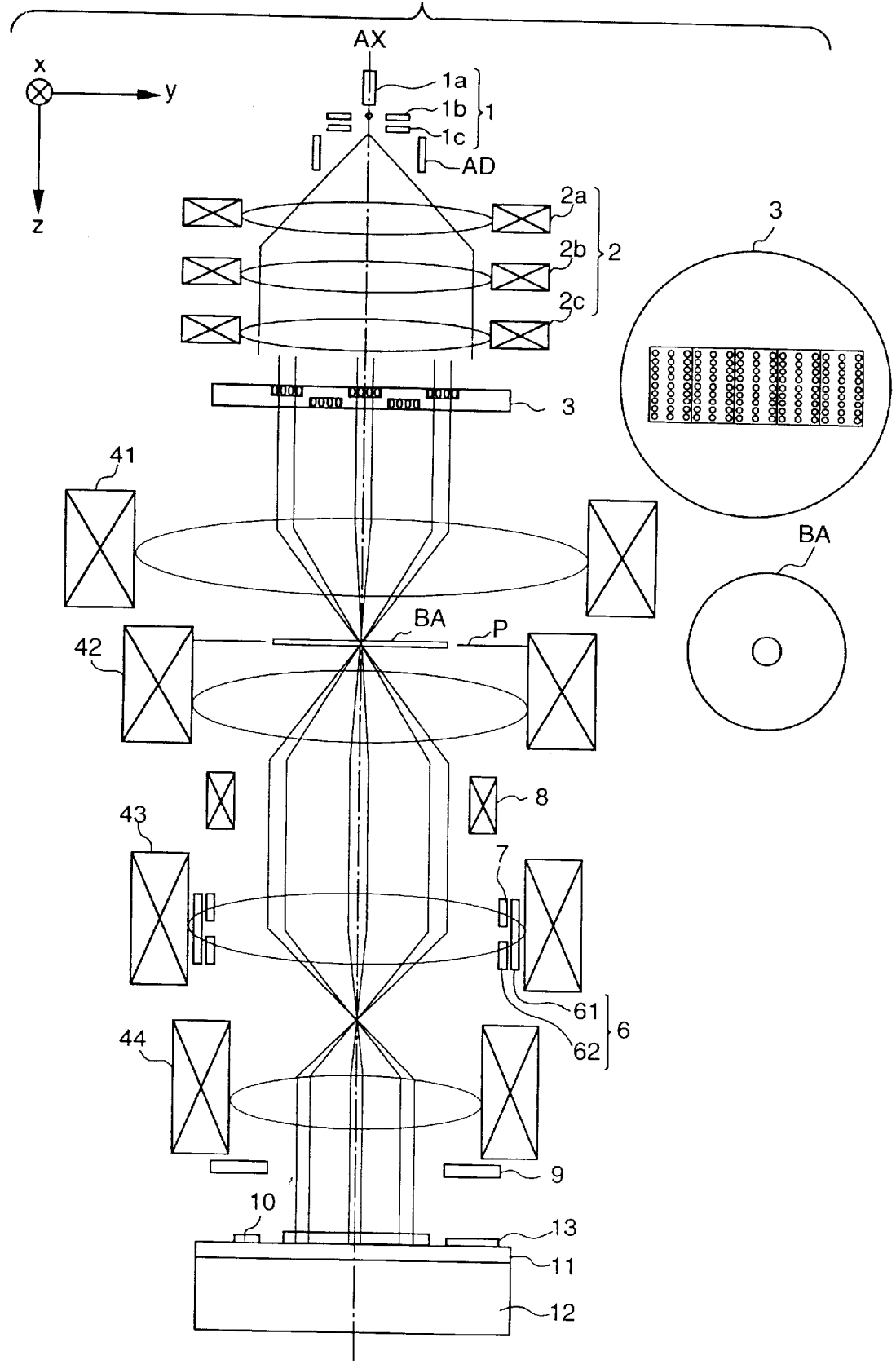
FIG. 1 is a schematic view showing a principal part of an electron beam exposure apparatus according to the present invention.

FIG. 1 is a schematic view showing a principal part of an electron beam exposure apparatus according to the present invention.

Referring to FIG. 1, reference numeral 1 denotes an electron gun made up of a cathode 1a, grid 1b, and anode 1c. Electrons emitted by the cathode 1a form a crossover image between the grid 1b and anode 1c. The crossover image will be referred to as an electron source hereinafter.

Electrons coming from this electron source are converted into nearly collimated electron beams by an illumination electron optical system 2 whose front-side focal point position is located at the electron source position. The nearly collimated electron beams illuminate an elementary optical system array 3. The illumination electron optical system 2 is made up of electron lenses 2a, 2b, and 2c. By adjusting the electron optical powers (focal lengths) of at least two of the electron lenses 2a, 2b, and 2c, the focal length of the illumination electron optical system 2 can be changed while holding its focal point position on the electron source side. In other words, the focal length of the illumination electron optical system 2 can be changed while obtaining nearly collimated electron beams from the illumination electron optical system 2.

The nearly collimated electron beams coming from the illumination electron optical system 2 enter the elementary electron optical system array 3. The elementary electron optical system array 3 is formed by arranging a plurality of elementary electron optical systems, each consisting of an aperture, electron lens, and blanking electrode, in directions perpendicular to an optical axis AX. The elementary electron optical system 3 will be explained in detail later.

The elementary electron optical system array 3 forms a plurality of intermediate images of the electron source. These intermediate images are projected in a reduced scale by a reduction electron optical system 4 (to be described later), and form images of the electron source on a wafer 5. Note that the size Wm of the intermediate image of the electron source is given by:

$$Wm = Ws \times Fe/Fi$$

where Ws is the size of the electron source, Fi is the focal length of the illumination electron optical system 2, and Fe is the focal length of each electron optical system of the elementary electron optical system.

Hence, when the focal length of the illumination electron optical system 2 is changed, the sizes of the plurality of intermediate images of the electron source can be changed at the same time. Therefore, the sizes of a plurality of electron source images on the wafer 5 can be changed at the same time. Upon changing the focal length of the illumination electron optical system 2, the optical axis of the illumination electron optical system 2 may change accordingly. More specifically, the positional relationship between the illumination electron optical system 2 and electron source changes before and after the focal length of the illumination electron optical system 2 is changed. As a consequence, the positions of the intermediate images of the electron source deviate before and after the focal length of the illumination electron optical system 2 is changed, and the plurality of electron source images on the wafer 5 undergo position deviations before and after the focal length of the illumination electron optical system 2 is changed. Reference symbol AD denotes an axis adjustment deflector for moving the position of the electron source relative to the illumination electron optical system 2 in the X- and Y-directions. By adjusting the position of the electron source relative to the illumination electron optical system 2, the position deviations of the intermediate images of the electron source before and after the change in focal length of the illumination electron optical system 2 are corrected, thereby correcting the position deviations of the plurality of electron images on the wafer 5.

The focal lengths of elementary electron optical systems are set to be approximately equal to each other to obtain nearly equal sizes of the electron source images on the wafer 5. Furthermore, the elementary electron optical system array 3 makes the positions of the individual intermediate images differ in the optical axis direction in correspondence with the curvature of field of the reduction electron optical system 4, and corrects in advance any aberrations expected to be produced when the individual intermediate images are projected onto the wafer 5 in a reduced scale by the reduction electron optical system 4.

The reduction electron optical system 4 comprises a symmetric magnetic doublet consisting of a first projection lens 41 (43) and second projection lens 42 (44). If f1 represents the focal length of the first projection lens 41 (43), and f2 represents the focal length of the second projection lens 42 (44), the distance between these two lenses is f1+f2. The object point on the optical axis AX is located at the focal point position of the first projection lens 41 (43), and its image point is formed at the focal point of the second projection lens 42 (44). This image is reduced to −f2/f1. Since two lens magnetic fields are determined to act in opposite directions, the Seidel aberrations and chromatic aberrations pertaining to rotation and magnification theoretically cancel each other, except for five aberrations, i.e., spherical aberration, isotropic astigmatism, isotropic coma, curvature of field, and on-axis chromatic aberration.

Reference numeral 6 denotes a deflector for deflecting a plurality of electron beams coming from the elementary electron optical system array 3 to displace a plurality of electron source images by nearly equal deflection amounts in the X- and Y-directions on the wafer 5. The deflector 6 comprises a main deflector 61 which has a large deflection width but requires a long time until settlement, i.e., a long settlement wait time, and a sub deflector 62 which has a small deflection width but requires only a short settlement wait time. The main deflector 61 is an electromagnetic type deflector, and the sub deflector 62 is an electrostatic type deflector.

Reference numeral 7 denotes a dynamic focus coil that corrects any deviations of the focus positions of the electron source images arising from deflection aberration produced upon operation of the deflector 6; and 8, a dynamic stigmatic coil that corrects astigmatism of deflection aberration produced upon deflection as in the dynamic focus coil 7.

Reference numeral 9 denotes a reflected electron detector for detecting reflected or secondary electrons produced when electron beams coming from the elementary electron optical system array 3 strike alignment marks formed on the wafer 5 or marks on a stage reference plate 13.

Reference numeral 10 denotes a Faraday cup having two single knife edges respectively extending in the X- and Y-directions. The Faraday cup detects the charge amount of electron source images formed by the electron beams coming from the elementary electron optical systems.

Reference numeral 11 denotes a θ-Z stage that carries a wafer, and is movable in the direction of the optical axis AX (Z-axis) and in the direction of rotation about the Z-axis. The above-mentioned stage reference plate 13 and the Faraday cup 10 are fixed on the stage 11.

Reference numeral 12 denotes an X-Y stage which carries the θ-Z stage and is movable in the X- and Y-directions perpendicular to the direction of the optical axis AX (Z-axis).

Figure 2A:
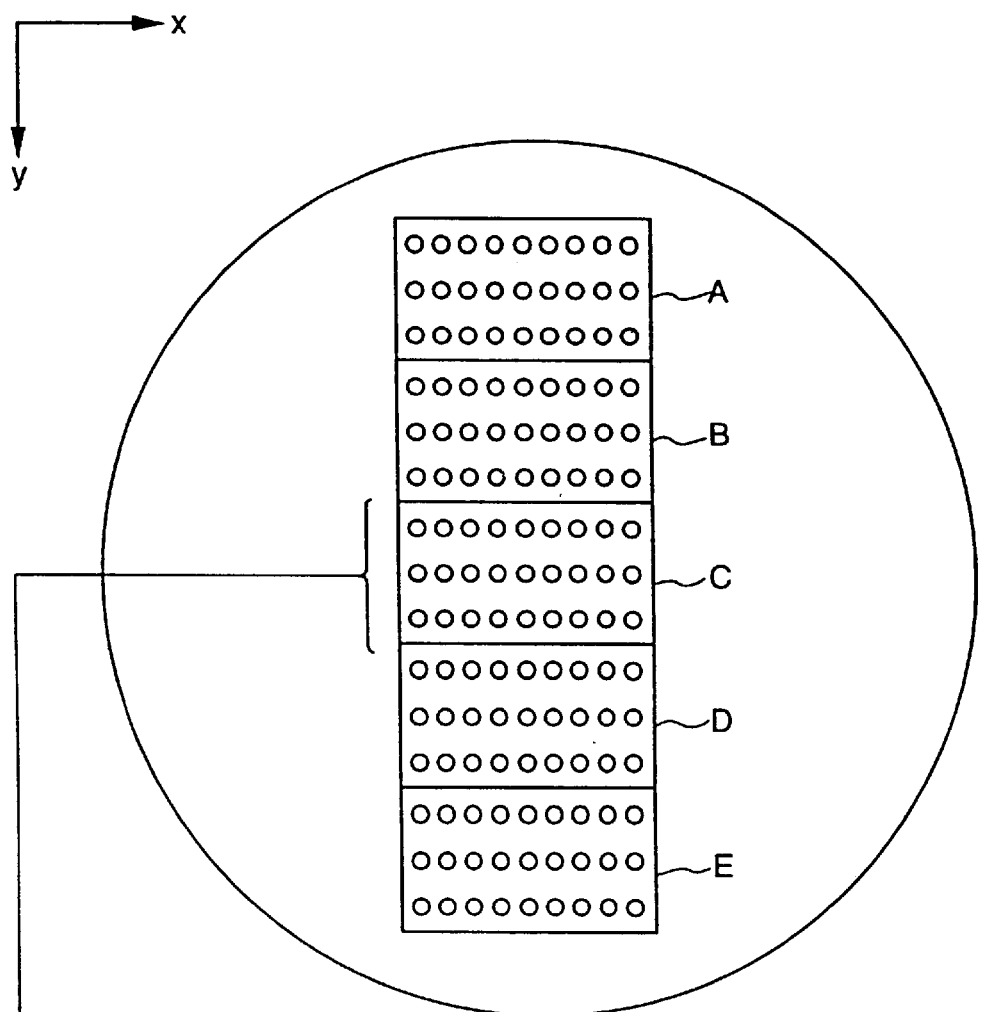
FIGS. 2A and 2B are views for explaining an elementary electron optical system array 3.
Figure 2B:
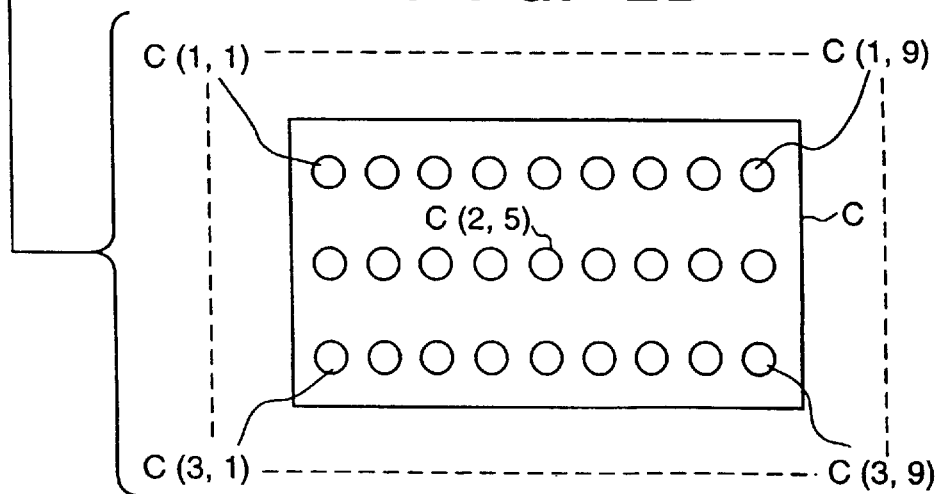

In the elementary electron optical system array 3, a plurality of elementary electron optical systems form a group (subarray), and a plurality of subarrays are formed. In the example shown in FIG. 2A, five subarrays A to E are formed. In each subarray, as shown in FIG. 2B, a plurality of elementary electron optical systems are two-dimensionally arranged, and 27 elementary electron optical systems (e.g., C(1,1) to C(3,9)) are formed in each subarray.

Figure 3:
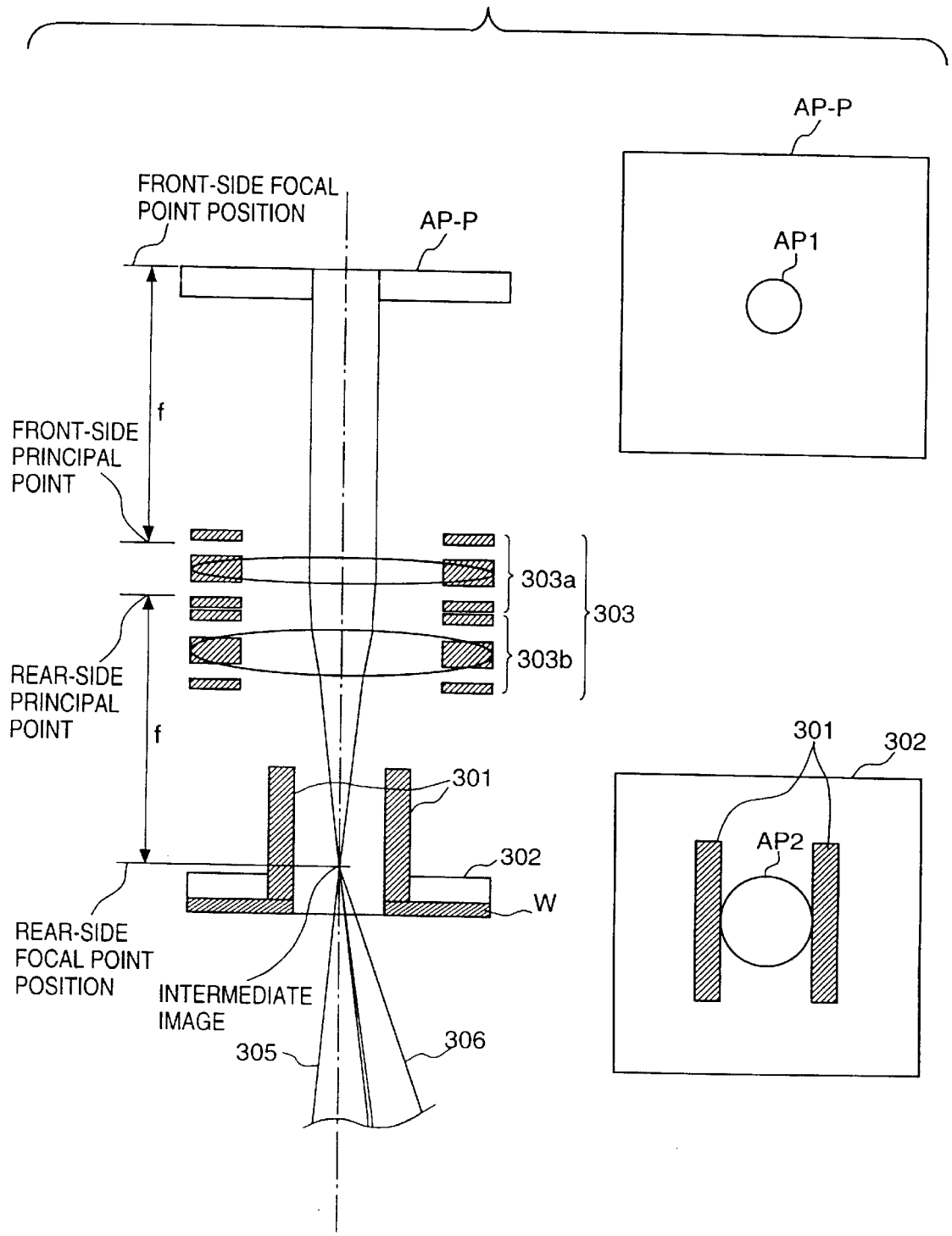
FIG. 3 is a view for explaining an elementary electron optical system.

FIG. 3 is a sectional view of each elementary electron optical system.

Referring to FIG. 3, a substrate AP-P is irradiated with electron beams nearly collimated by the illumination electron optical system 2. The substrate AP-P has an aperture (AP1) that defines the shape of electron beams to be transmitted, and is common to other elementary electron optical systems. That is, the substrate AP-P is a substrate having a plurality of apertures.

Reference numeral 301 denotes a blanking electrode which is made up of a pair of electrodes and has a deflection function; and 302, a substrate which has an aperture (AP2) larger than the aperture (AP1) and is common to other elementary electron optical systems. On the substrate 302, the blanking electrode 301 and wiring (W) for turning on/off the electrodes are formed. That is, the substrate 302 has a plurality of apertures and a plurality of blanking electrodes.

Reference numeral 303 denotes an electron optical system, which uses two unipotential lenses 303*a* and 303*b*. Each unipotential lens is made up of three aperture electrodes, and has a convergence function by setting the upper and lower electrodes at the same potential as an acceleration potential V0, and keeping the intermediate electrode at another potential V1 or V2. The individual aperture electrodes are stacked on a substrate via insulating materials, and the substrate is common to other elementary electron optical systems. That is, the substrate has a plurality of electron optical systems 303.

Figure 4A:
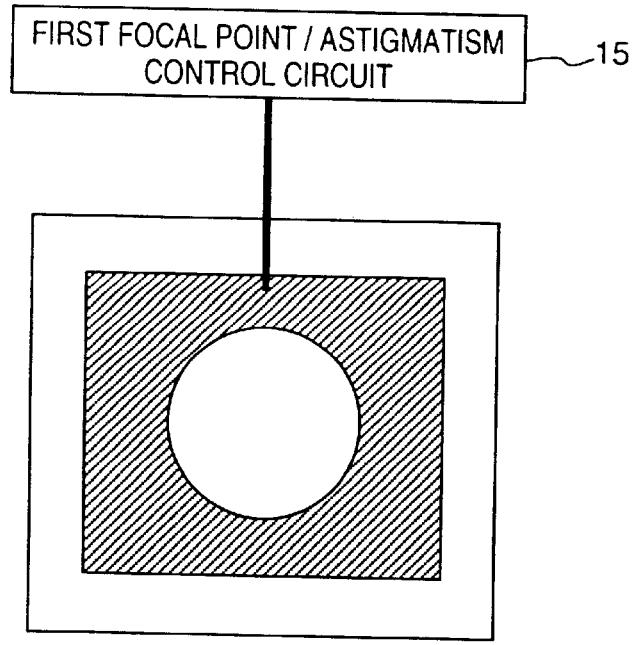
FIGS. 4A and 4B are views for explaining the electrodes of the elementary electron optical system.

The upper, intermediate, and lower electrodes of the unipotential lens 303*a* and the upper and lower electrodes of the unipotential lens 303*b* have a shape shown in FIG. 4A, and the upper and lower electrodes of the unipotential lenses 303*a* and 303*b* are set at a common potential in all the elementary electron optical systems by a first focal point astigmatism control circuit 15 (to be described later).

Since the potential of the intermediate electrode of the unipotential lens 303*a* can be set by the first focal point astigmatism control circuit 15 in units of elementary electron optical systems, the focal length of the unipotential lens 303*a* can be set in units of elementary electron optical systems.

Figure 4B:
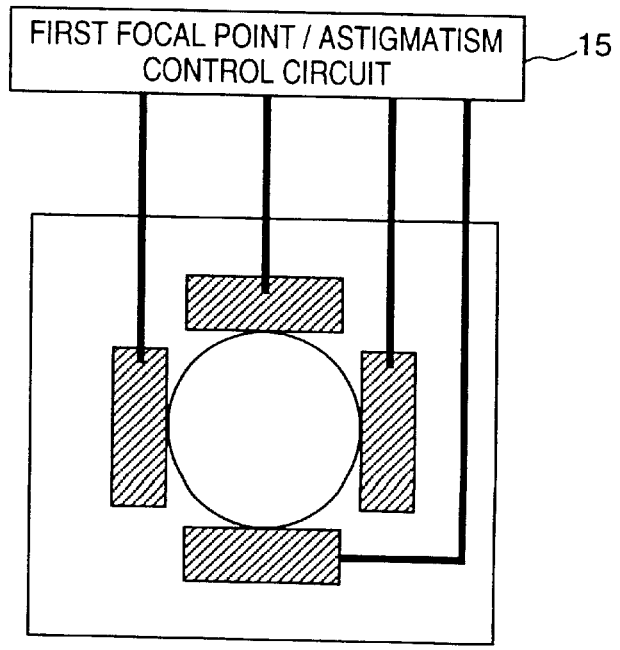

The intermediate electrode of the unipotential lens 303*b* is made up of four electrodes, as shown in FIG. 4B, and the potentials of these electrodes can be set independently and also individually in units of elementary electron optical systems by the first focal point astigmatism control circuit 15. Hence, the unipotential lens 303*b* can have different focal lengths in a section perpendicular to its optical axis and can set them individually in units of elementary electron optical systems.

As a consequence, by respectively controlling the potentials of the intermediate electrodes of the electron optical systems 303, the electron optical characteristics (the intermediate image forming positions and astigmatism) of the elementary electron optical systems can be controlled. Upon controlling the intermediate image forming positions, since the size of each intermediate image is determined by the ratio between the focal lengths of the illumination electron optical system 2 and each electron optical system 303, the intermediate image forming position is moved by setting a constant focal length of each electron optical system 303 and moving its principal point position. With this control, the intermediate images formed by all the elementary electron optical systems can have nearly equal sizes and different positions in the optical axis direction.

Each nearly collimated electron beam output from the illumination electron optical system 2 forms an intermediate image of the electron source via the aperture (AP1) and electron optical system 303. Note that the aperture (AP1) is located at or in the vicinity of the front-side focal point position of the corresponding electron optical system 303, and the blanking electrode 301 is located at or in the vicinity of the intermediate image forming position (rear-side focal point position) of the corresponding electron optical system 303. For this reason, if no electric field is applied across the electrodes of the blanking electrode 301, the electron beam is not deflected, as indicated by an electron beam 305 in FIG. 3. On the other hand, if an electric field is applied across the electrodes of the blanking electrode 301, the electron beam is deflected, as indicated by an electron beam 306 in FIG. 3. Since the electron beams 305 and 306 have different angle distributions on the object plane of the reduction electron optical system 4, they become incident on different regions at the pupil position (on a plane P in FIG. 1) of the reduction electron optical system 4. Hence, a blanking aperture BA that transmits the electron beam 305 alone is formed at the pupil position (on the plane P in FIG. 1) of the reduction electron optical system.

The electron optical systems 303 of the elementary electron optical systems individually set the potentials of their two intermediate electrodes so as to correct the curvature of field and astigmatism produced when the intermediate images formed thereby are projected in a reduced scale onto the surface to be exposed by the reduction electron optical system 4, thereby making the electron optical characteristics (intermediate image forming positions and astigmatism) of the elementary electron optical systems different. However, in this embodiment, in order to decrease the number of wiring lines between the intermediate electrodes and the first focal point astigmatism control circuit 15, the elementary electron optical systems included in a single subarray have identical electron optical characteristics, and the electron optical characteristics (intermediate image forming positions and astigmatism) of the elementary electron optical systems are controlled in units of subarrays.

Furthermore, in order to correct distortion produced when a plurality of intermediate images are projected in a reduced scale onto the surface to be exposed by the reduction electron optical system 4, the distortion characteristics of the reduction electron optical system 4 are detected in advance, and the positions of the elementary electron optical systems in directions perpendicular to the optical axis of the reduction electron optical system 4 are set based on the detected characteristics.

FIG. 5 shows the system arrangement of this embodiment. An axis control circuit AXC controls the axis adjustment deflector AD to correct the position deviations of the intermediate images of the electron source before and after the change in focal length of the illumination electron optical system 2. A focal length control circuit FC controls the focal length of the illumination electron optical system 2 while holding its focal point position on the electron source side, by adjusting the electron optical powers (focal lengths) of at least two of the electron lenses 2a, 2b, and 2c.

A blanking control circuit 14 individually ON/OFF-controls the blanking electrodes of the elementary electron optical systems in the elementary electron optical system array 3, and the first focal point astigmatism control circuit 15 individually controls the electron optical characteristics (intermediate image forming positions and astigmatism) of the elementary electron optical systems in the elementary electron optical system array 3.

A second focal point astigmatism control circuit 16 controls the focal point position and astigmatism of the reduction electron optical system 4 by controlling the dynamic stigmatic coil 8 and dynamic focus coil 7. A deflection control circuit 17 controls the deflector 6. A magnification adjustment circuit 18 adjusts the magnification of the reduction electron optical system 4. An optical characteristic adjustment circuit 19 adjusts rotation aberration and optical axis position by changing the excitation currents of electromagnetic lenses that make up the reduction electron optical system 4.

A stage drive control circuit 20 controls driving of the θ-Z stage, and also controls driving of the X-Y stage 12 in collaboration with a laser interferometer 21 that detects the position of the X-Y stage 12.

A control system 22 synchronously controls the above-mentioned control circuits, reflected electron detector 9, and Faraday cup 10 to attain exposure and alignment based on exposure control data from a memory 23. The control system 22 is controlled by a CPU 25 for controlling the entire electron beam exposure apparatus via an interface 24.

(Explanation of Operation)

Exposure operation by the electron beam exposure apparatus of this embodiment will be explained below with the aid of FIG. 5.

Figure 6A:
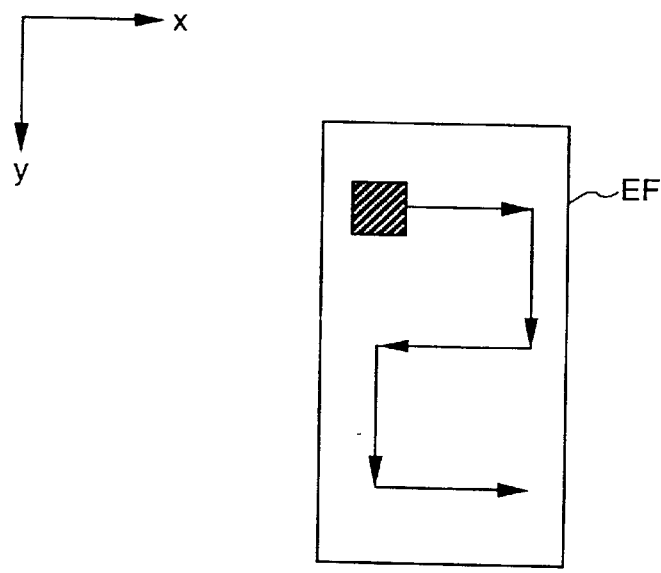
FIGS. 6A and 6B are views for explaining an elementary exposure field (EF) and an subarray exposure field (SEF)
Figure 6B:
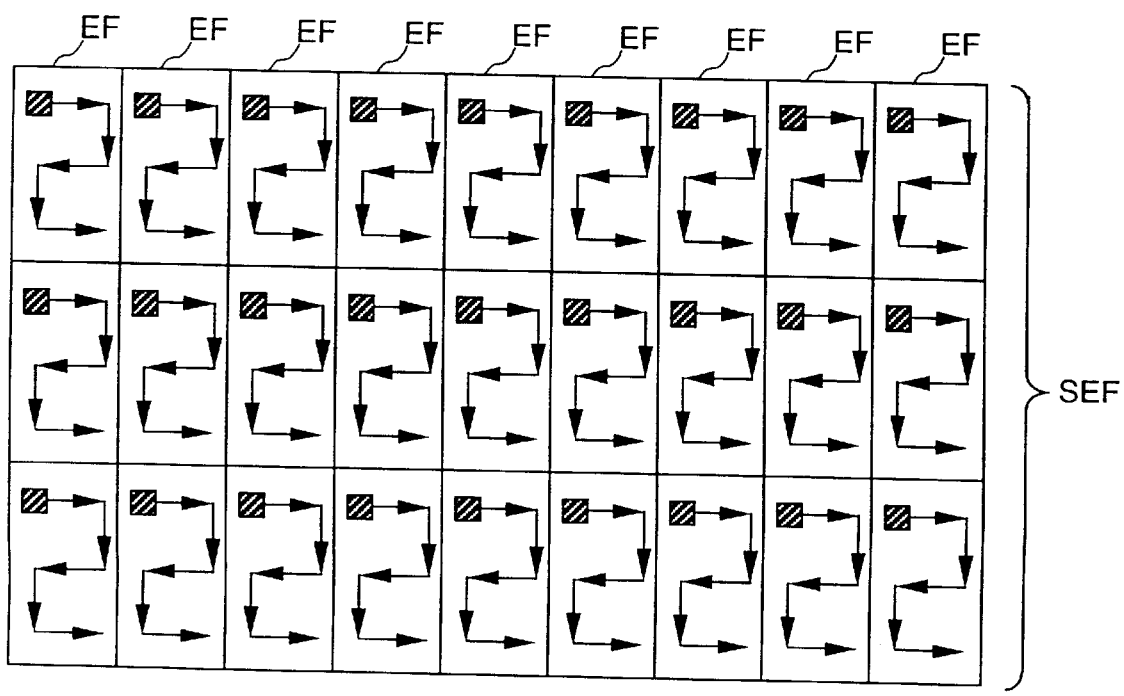
Figure 7A:
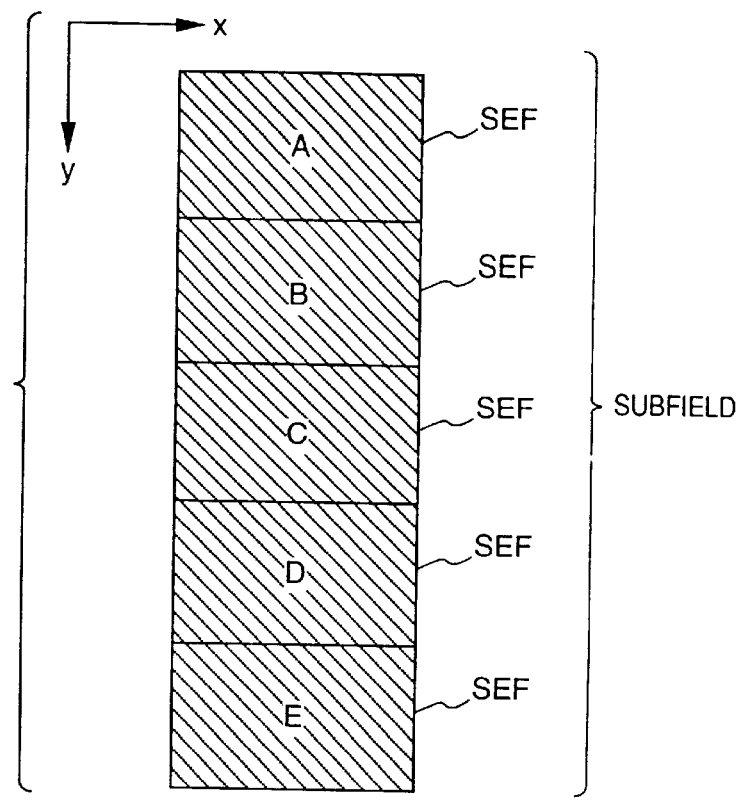
FIGS. 7A and 7B are views for explaining the subfields.

The control system 22 directs the deflection control circuit 17 based on the exposure control data from the memory 23 to deflect a plurality of electron beams from the elementary electron optical system array by the sub deflector 62 of the deflector 6. Also, the control system 22 directs the blanking control circuit 14 to turn on/off the blanking electrodes of the respective elementary electron optical systems in accordance with the pattern to be formed by exposure on the wafer 5. At this time, the X-Y stage 12 is continuously moving in the X-direction. An electron beam coming from one elementary electron optical system scans and exposes an exposure field (EF) on the wafer 5 to have the full square as a start point, as shown in FIG. 6A. Also, as shown in FIG. 6B, the exposure fields (EF) of the plurality of elementary electron optical systems in each subarray are set adjacent to each other. Consequently, a subarray exposure field (SEF) including a plurality of exposure fields (EF) is exposed on the wafer 5. At the same time, a subfield made up of subarray exposure fields (SEF) respectively formed by the subarrays A to E is exposed on the wafer 5, as shown in FIG. 7A. In other words, the subfield made up of a plurality of elementary exposure fields (EF) is exposed.

Figure 7B:
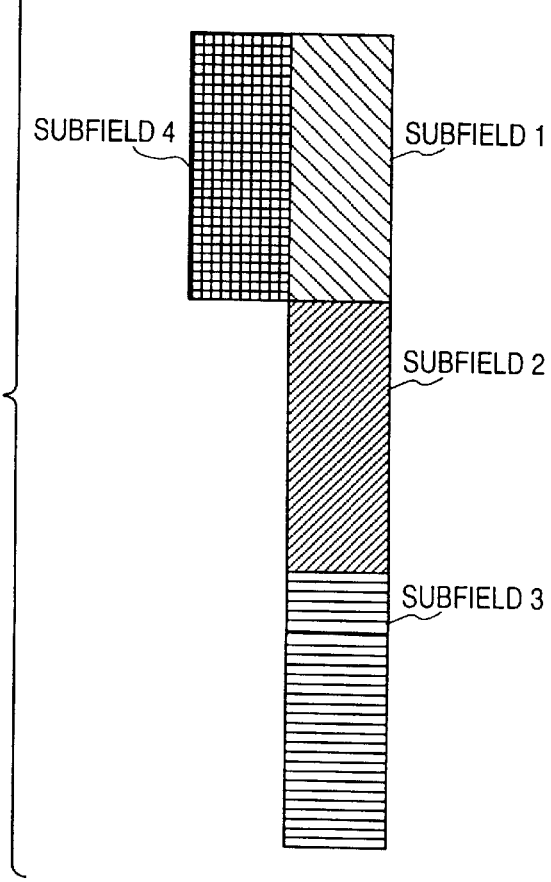
Figure 8:
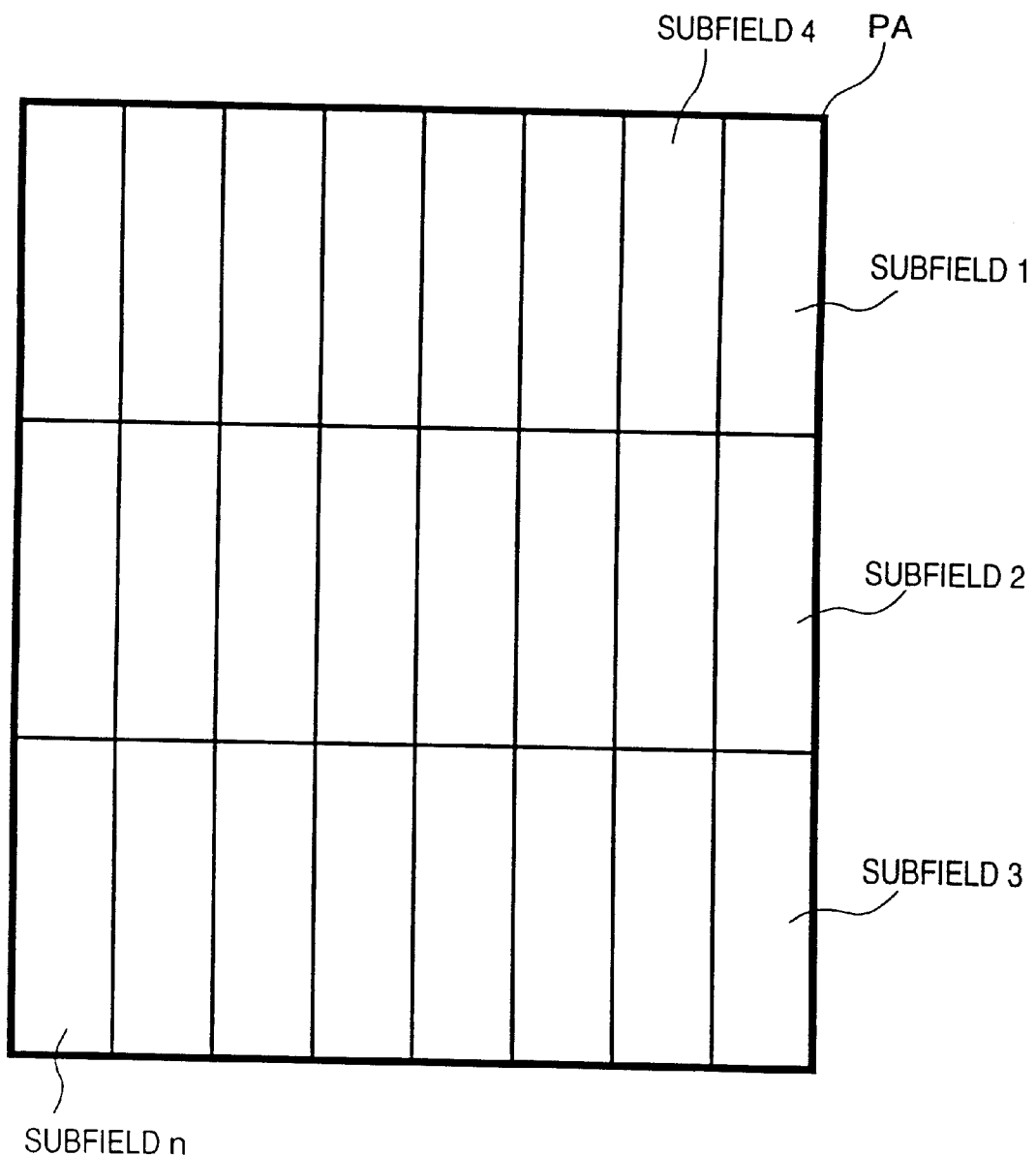
FIG. 8 is a view for explaining the relationship between the subfields and the pattern area.

The control system 22 directs the deflection control circuit 17 to deflect a plurality of electron beams coming from the elementary electron optical system array using the main deflector 61 of the deflector 6 so as to expose subfield 2 after exposure of subfield 1 shown in FIG. 7B. Again, as described above, the control system 22 directs the deflection control circuit 17 to deflect a plurality of electron beams coming from the elementary electron optical system array by the sub deflector 62 of the deflector 6, and directs the blanking control circuit 14 to turn on/off the blanking electrodes of the respective elementary electron optical systems in accordance with the pattern to be formed by exposure on the wafer 5, thus exposing subfield 2. The subfields are then exposed in turn like subfields 3 and 4, as shown in FIG. 7B, thus forming the pattern on the wafer 5. More specifically, as shown in FIG. 8, if PA represents a pattern area based on pattern data, the electron beam exposure apparatus of this embodiment sequentially exposes the pattern area PA in units of subfields.

Some methods pertaining to generation of the exposure control data and the exposure procedure based on the exposure control data will be exemplified below.

<First Method>
(Explanation of Generation of Exposure Control Data)

The method of generating exposure control data of the electron beam exposure apparatus of this embodiment will be explained below.

Figure 9:
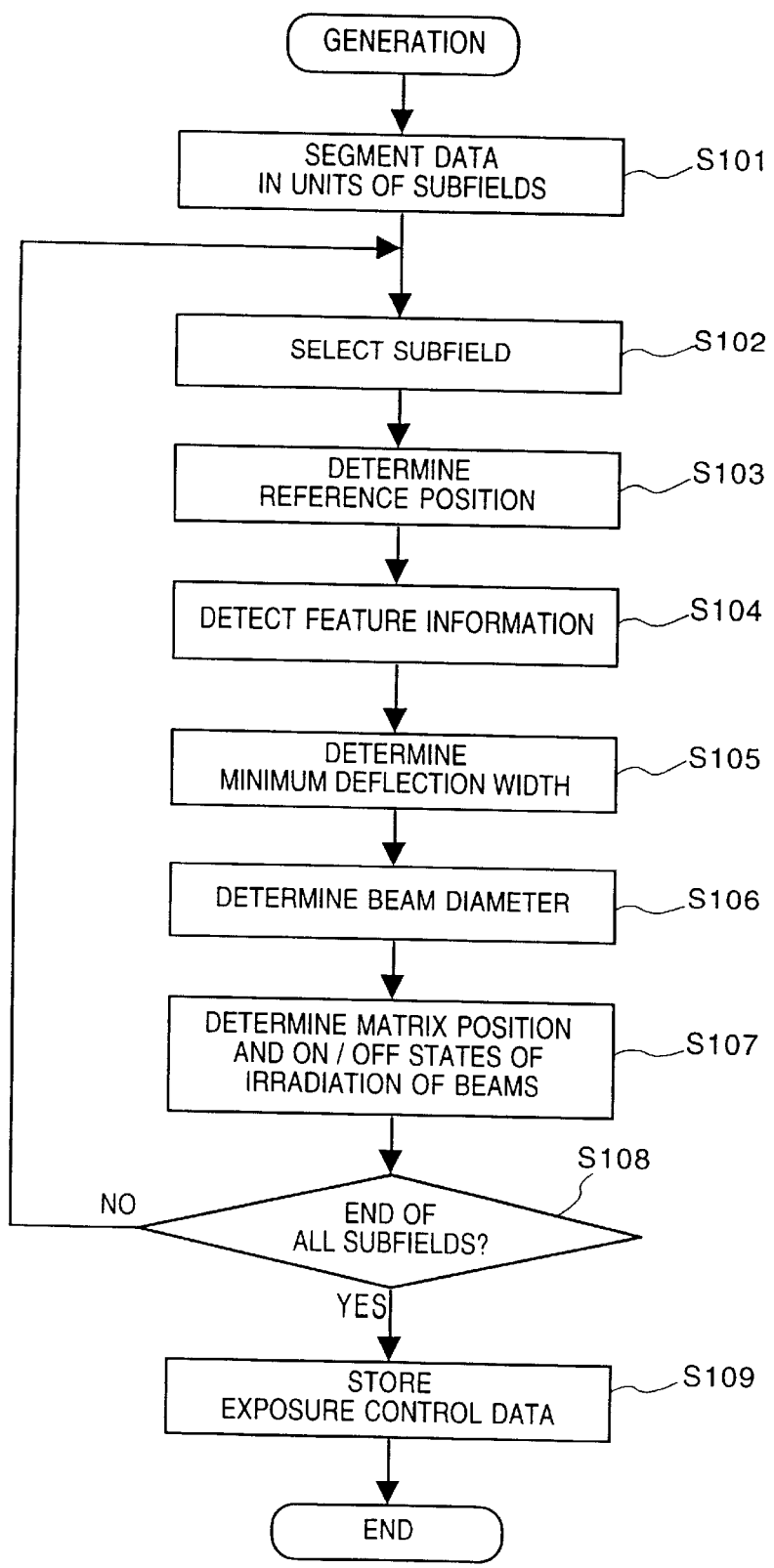
FIG. 9 is a flow chart for explaining generation of exposure control data.

Upon reception of pattern data to be formed by exposure on the wafer, the CPU 25 executes processing for generating exposure control data, as shown in FIG. 9.

The respective steps will be described.

(Step S101)

The input pattern data is segmented into data in units of subfields defined by the electron beam exposure apparatus of this embodiment.

(Step S102)

One subfield is selected.

(Step S103)

A deflection position (reference position) defined by the main deflector 61 upon exposing the selected subfield is determined.

(Step S104)

Feature information (e.g., the minimum line width, type of line width, shape) of a pattern is detected from the pattern data of the selected subfield. In this embodiment, the minimum line width is detected.

(Step S105)

The minimum deflection width that the sub deflector 62 gives to an electron beam is determined based on the detected feature information. In this embodiment, the minimum deflection width is determined so that an integer multiple of the minimum deflection width agrees with the matrix pitch (on the wafer) of a plurality of electron beams and approximately ¼ the minimum line width.

(Step S106)

An electron beam diameter optimal for the determined minimum deflection width (the size of an electron beam imaged on the wafer) is determined. In this embodiment, the electron beam diameter is determined to be nearly equal to the diameter of a circumscribed circle of a square having one side equal to the minimum deflection width.

(Step S107) The pattern data of the selected subfield is segmented into pattern data in units of elementary exposure fields corresponding to the elementary electron optical systems, and a common matrix made up of matrix elements FME using the determined minimum deflection amount of the sub deflector 62 as a matrix spacing is set, thus converting the pattern data into those expressed on the common matrix in units of elementary electron optical systems. The processing pertaining to pattern data upon exposure using two elementary electron optical systems a and b will be described below for the sake of simplicity.

FIGS. 10A and 10B show patterns Pa and Pb to be formed by exposure by the neighboring elementary electron optical systems a and b on a common deflection matrix DM. Each elementary electron optical system irradiates an electron beam onto the wafer by turning off its blanking electrode at hatched matrix positions with pattern portions. For this purpose, the CPU 25 determines first regions FF (solid black portions) consisting of matrix positions corresponding to exposure positions of at least one of the elementary electron optical systems a and b, and second regions NN (blank portions) consisting of matrix positions when neither of the elementary electron optical systems a and b commonly performs exposure, as shown in FIG. 10C, on the basis of the matrix position data to be exposed in units of elementary electron optical systems shown in FIGS. 10A and 10B. When a plurality of electron beams are located on the first region FF on the matrix, exposure is done by deflecting and settling the electron beams by the deflector 6 in units of minimum deflection amounts (the matrix spacings), thus forming all the patterns to be drawn on the wafer by exposure. When a plurality of electron beams are located on the second region NN on the matrix, they are deflected without settling their positions, thereby attaining exposure while eliminating unnecessary deflection of the electron beams. In other words, after exposure of the first region (FF), when the electron beams are deflected to expose the next first region (FF) while skipping the second region (NN), the number of times of deflection that requires a long settling time can be reduced, and exposure can be attained within a shorter period of time. Subsequently, the CPU 25 determines the matrix positions of matrix elements to be exposed on the basis of data pertaining to the regions FF and NN shown in FIG. 10C. Also, the CPU 25 determines the ON/OFF patterns of blanking electrodes corresponding to the matrix positions to be settled of the electron beams in units of elementary electron optical systems on the basis of data representing the patterns shown in FIGS. 10A and 10B. Since matrix numbers are assigned in advance to the respective matrix elements, the matrix numbers are determined as the matrix positions.

(Step S108)

It is checked if the processing in steps S103 to S107 is complete for all the subfields. If non-processed subfields remain, the flow returns to step S102 to select the non-processed subfield.

(Step S109)

Upon completion of the processing in steps S103 to S107 for all the subfields, exposure control data is stored. As shown in FIG. 11, the exposure control data contains as elements the reference positions and electron beam diameters defined by the main deflector 61, the minimum deflection width of the sub deflector 62, the matrix positions defined by the sub deflector 62, and the ON/OFF states of the electron beam irradiation of the respective elementary electron optical systems at the corresponding matrix positions.

In this embodiment, the above-mentioned processing steps are implemented by the CPU 25 of the electron beam exposure apparatus but may be implemented by another processing device, and the obtained exposure control data may be transferred to the CPU 25 to achieve the above object and to obtain the same effects as above.

(Explanation of Exposure Based on Exposure Control Data)

Figure 12:
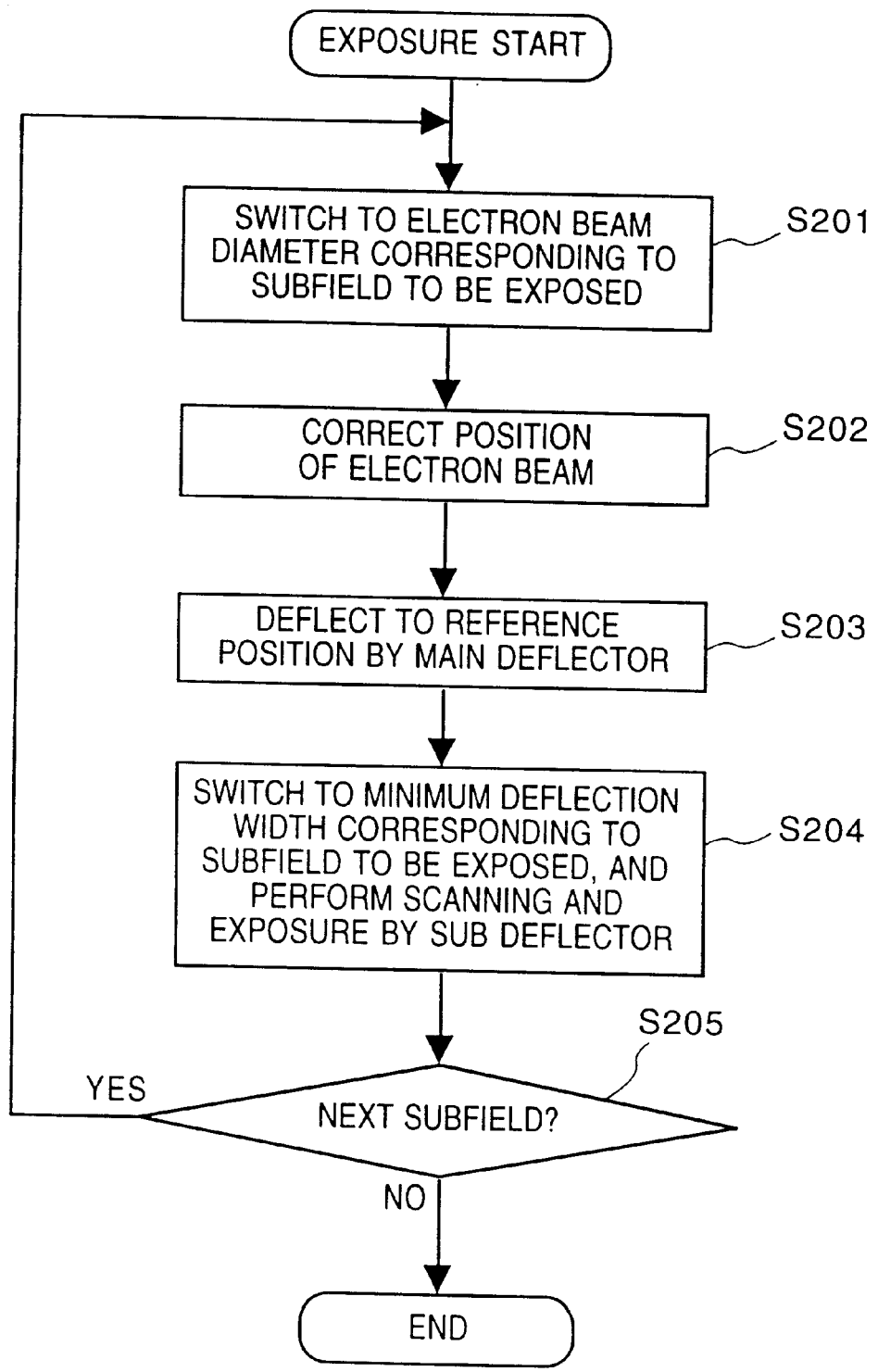
FIG. 12 is a flow chart for explaining exposure based on the exposure control data.

When the CPU 25 instructs the control system 22 to "execute exposure" via the interface 24, the control system 22 executes the steps shown in FIG. 12 on the basis of the exposure control data on the memory 23 in response to this instruction.

The individual steps will be explained below.

(Step S201)

The control system directs the focal length control circuit Fc to adjust the electron optical powers (focal lengths) of at least two of the electron lenses 2a, 2b, and 2c that make up the illumination electron optical system 2, so as to obtain the electron beam diameters corresponding to the subfield to be exposed. In this way, the focal length of the illumination electron optical system 2 is adjusted while holding the focal point position of the illumination electron optical system 2 on the electron source side, thereby changing the sizes (electron beam diameters) of a plurality of electron source images on the wafer 5 to that designated by the exposure control data.

(Step S202)

In order to correct the position deviations of the electron source images before and after the change in focal length of the illumination electron optical system 2, the control system 22 directs the axis control circuit AXC to move the position of the electron source relative to the illumination electron optical system 2 in the X- and Y-directions by the axis adjustment deflector AD, thereby correcting the position deviations.

(Step S203)

The control system 22 directs the deflection control circuit 17 to deflect a plurality of electron beams coming from the elementary electron optical system array by the main deflector 61 so that the electron beams are located at the reference positions upon exposing the subfield. Furthermore, the control system 22 directs the second focal point astigmatism control circuit 16 to control the dynamic focus coil 7 in correspondence with the deflection attained by the main deflector 61 on the basis of dynamic focal point correction data obtained in advance to correct the focal point position of the reduction electron optical system 4, and to control the dynamic stigmatic coil 8 on the basis of dynamic astigmatism correction data obtained in advance to correct astigmatism of the reduction electron optical system.

(Step S204)

The control system 22 directs the deflection control circuit 17 to switch the minimum deflection width of the sub deflector 62 to that corresponding to the subfield to be exposed, and to deflect a plurality of electron beams coming from the elementary electron optical system array in units of switched minimum deflection widths by the sub deflector 62. Also, the control system 22 directs the blanking control circuit 14 to turn on/off the blanking electrodes of the elementary electron optical systems in correspondence with the pattern to be formed by exposure on the wafer 5. At this time, the X-Y stage 12 is continuously moving in the X-direction, and the deflection control circuit 17 controls the deflection positions of the electron beams in consideration of the moving amount of the X-Y stage 12. As a result, an electron beam coming from one elementary electron optical system scans and exposes an exposure field (EF) on the wafer 5 to have a full square as a start point, as shown in FIG. 6A. Also, as shown in FIG. 6B, the exposure fields (EF) of the plurality of elementary electron optical systems in each subarray are set adjacent to each other. Consequently, a subarray exposure field (SEF) including a plurality of exposure fields (EF) is exposed on the wafer 5. At the same time, a subfield made up of subarray exposure fields (SEF) respectively formed by the subarrays A to E is exposed on the wafer 5, as shown in FIG. 7A. In other words, the subfield made up of a plurality of elementary exposure fields (EF) is exposed.

(Step S205)

If the next subfield to be exposed remains, the flow returns to step S201; otherwise, exposure ends.

<Second Method>

(Explanation of Generation of Exposure Control Data)

The method of generating exposure control data of the electron beam exposure apparatus of this embodiment will be explained below.

Figure 16:
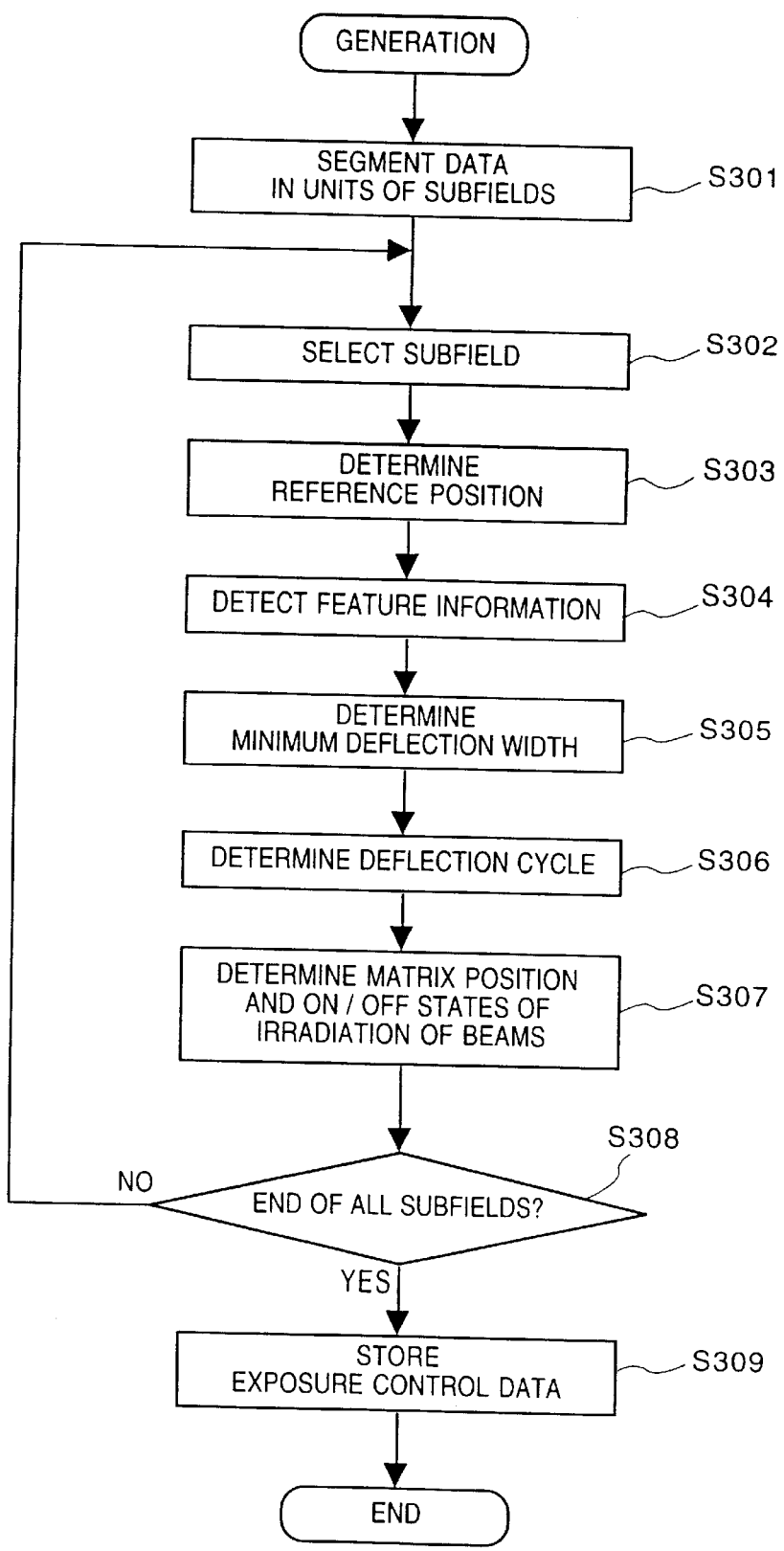
FIG. 16 is a flow chart for explaining generation of exposure control data.

Upon reception of pattern data to be formed by exposure on the wafer, the CPU 25 executes processing for generating exposure control data, as shown in FIG. 16.

The respective steps will be described.

(Step S301)

The input pattern data is segmented into data in units of subfields defined by the electron beam exposure apparatus of this embodiment.

(Step S302)

One subfield is selected.

(Step S303)

A deflection position (reference position) defined by the main deflector 61 upon exposing the selected subfield is determined.

(Step S304)

Feature information (e.g., the minimum line width, type of line width, shape) of a pattern is detected from the pattern data of the selected subfield. In this embodiment, the minimum line width is detected.

(Step S305)

The minimum deflection width that the sub deflector 62 gives an electron beam is determined based on the detected feature information. In this embodiment, the minimum deflection width is determined so that an integer multiple of the minimum deflection width agrees with the matrix pitch (on the wafer) of a plurality of electron beams and approximately ¼ the minimum line width.

(Step S306)

The size of a dot pattern that each electron beam forms on a resist on the wafer must be changed in correspondence with the determined minimum deflection width. In this embodiment, the electron beam diameter (the size of the electron beam to be imaged on the wafer) is fixed, and the time for which the electron beam undergoes settlement at the deflection position (so-called exposure time) is changed, thereby changing the size of the dot pattern. More specifically, when the minimum deflection width is increased, the settling time is prolonged to increase the size of the dot pattern. Normally, if Ts represents the settling time of the electron beam at the deflection position, and To represents the settling wait time until the electron beam is deflected and settles to a desired deflection position, a deflection cycle Td of the sub deflector 62 is given by Td=Ts+To. For this reason, in this embodiment, since To is nearly constant, the deflection cycle Td of the sub deflector 62 is changed in correspondence with the determined minimum deflection width, thereby changing the size of a dot pattern. Hence, the deflection cycle Td of the sub deflector 62 is determined based on the determined minimum deflection width, the current density of the electron beam, the electron beam diameter, and the resist sensitivity. At this time, the size of the dot pattern is set to be nearly equal to a circumscribed circle of a square having one side equal to the minimum deflection width.

(Step S307)

The pattern data of the selected subfield is segmented into pattern data in units of elementary exposure fields corresponding to the elementary electron optical systems, and a common matrix made up of matrix elements FME using the determined minimum deflection amount of the sub deflector 62 as a matrix spacing is set, thus converting the pattern data into those expressed on the common matrix in units of elementary electron optical systems. The processing pertaining to pattern data upon exposure using two elementary electron optical systems a and b will be described below for the sake of simplicity.

FIGS. 10A and 10B show patterns Pa and Pb to be formed by exposure by the neighboring elementary electron optical systems a and b on a common deflection matrix DM. More specifically, each elementary electron optical system irradiates an electron beam onto the wafer by turning off its blanking electrode at hatched matrix positions with pattern portions. For this purpose, the CPU 25 determines first regions FF (solid black portions) consisting of matrix positions corresponding to exposure positions of at least one of the elementary electron optical systems a and b, and second regions NN (blank portions) consisting of matrix positions when neither of the elementary electron optical systems a and b commonly performs exposure, as shown in FIG. 10C, on the basis of the matrix position data to be exposed in units of elementary electron optical systems shown in FIGS. 10A and 10B. When a plurality of electron beams are located on the first region FF on the matrix, exposure is done by deflecting and settling the electron beams by the deflector 6 in units of minimum deflection amounts (the matrix spacings), thus forming all the patterns to be drawn on the wafer by exposure. When a plurality of electron beams are located on the second region NN on the matrix, they are deflected without settling their positions, thereby attaining exposure while eliminating unnecessary deflection of the electron beams. In other words, after exposure of the first region (FF), when the electron beams are deflected to expose the next first region (FF) while skipping the second region (NN), the number of times of deflection that requires a long settling time can be reduced, and exposure can be attained within a shorter period of time. Subsequently, the CPU 25 determines the matrix positions of matrix elements to be exposed on the basis of data pertaining to the regions FF and NN shown in FIG. 10C. Also, the CPU 25 determines the ON/OFF patterns of blanking electrodes corresponding to the matrix positions to be settled of the electron beams in units of elementary electron optical systems on the basis of data representing the patterns shown in FIGS. 10A and 10B. Since matrix numbers are assigned in advance to the respective matrix elements, the matrix numbers are determined as the matrix positions.

(Step S308)

It is checked if the processing in steps S303 to S307 is complete for all the subfields. If non-processed subfields remain, the flow returns to step S302 to select the non-processed subfield.

(Step S309)

Upon completion of the processing in steps S303 to S307 for all the subfields, exposure control data is stored. As shown in FIG. 17, the exposure control data contains as elements the reference positions and electron beam diameters defined by the main deflector 61, the minimum deflection width and deflection cycle of the sub deflector 62, the matrix positions defined by the sub deflector 62, and the ON/OFF states of the electron beam irradiation of the respective elementary electron optical systems at the corresponding matrix positions.

In this embodiment, the above-mentioned processing steps are implemented by the CPU 25 of the electron beam exposure apparatus but may be implemented by another processing device, and the obtained exposure control data may be transferred to the CPU 25 to achieve the above objective and to obtain the same effects as above.

(Explanation of Exposure Based on Exposure Control Data)

When the CPU 25 instructs the control system 22 to "execute exposure" via the interface 24, the control system 22 executes the steps shown in FIG. 18 on the basis of the exposure control data on the memory 23 in response to this instruction.

The individual steps will be explained below.

(Step S401)

The control system 22 directs the deflection control circuit 17 to set the deflection amount of the main deflector 61, so that a plurality of electron beams coming from the elementary electron optical system array are located at the reference positions upon exposing the subfield. Furthermore, the control system 22 directs the second focal point astigmatism control circuit 16 to control the dynamic focus coil 7 in correspondence with the deflection position of the main deflector on the basis of dynamic focal point correction data obtained in advance to correct the focal point position of the reduction electron optical system 4, and to control the dynamic stigmatic coil 8 on the basis of dynamic astigmatism correction data obtained in advance to correct astigmatism of the reduction electron optical system.

(Step S402)

The control system 22 directs the deflection control circuit 17 to switch the minimum deflection width and deflection cycle of the sub deflector 62 to those corresponding to the subfield to be exposed. Furthermore, a cycle signal defined by the deflection cycle is generated. In synchronism with the cycle signal, a plurality of electron beams coming from the elementary electron optical system array are deflected to the deflection positions defined by the exposure control data by the sub deflector 61 in units of switched minimum deflection widths. At the same time, the control system 22 directs the blanking control circuit 14 in synchronism with the cycle signal to turn on/off the blanking electrodes of the elementary electron optical systems in correspondence with the pattern to be formed by exposure on the wafer 5. At this time, the X-Y stage 12 is continuously moving in the X-direction, and the deflection control circuit 17 controls the deflection positions of the electron beams in consideration of the moving amount of the X-Y stage 12. As a result, an electron beam coming from one elementary electron optical system scans and exposes an exposure field (EF) on the wafer 5 to have a full square as a start point, as shown in FIG. 6A. Also, as shown in FIG. 6B, the exposure fields (EF) of the plurality of elementary electron optical systems in each subarray are set adjacent to each other. Consequently, a subarray exposure field (SEF) including a plurality of exposure fields (EF) is exposed on the wafer 5. At the same time, a subfield made up of subarray exposure fields (SEF) respectively formed by the subarrays A to E is exposed on the wafer 5, as shown in FIG. 7A.

(Step S403)

If the next subfield to be exposed remains, the flow returns to step S401; otherwise, exposure ends.

[Second Embodiment]

(Explanation of Constituting Elements of Electron Beam Exposure Apparatus)

Figure 19:
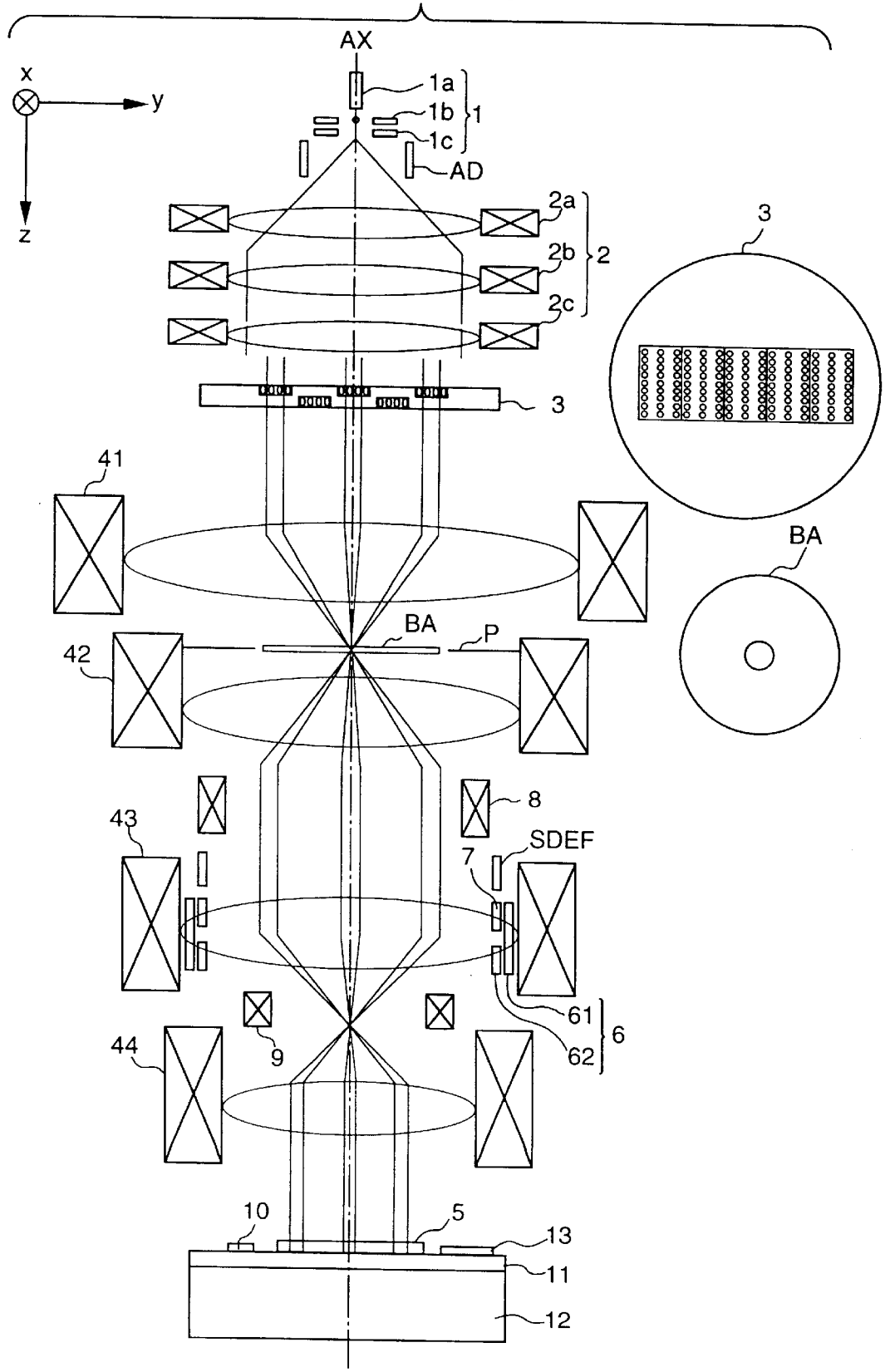
FIG. 19 is a schematic view showing a principal part of an electron beam exposure apparatus according to the present invention.

FIG. 19 is a schematic view showing a principal part of an electron beam exposure apparatus according to the present invention.

Referring to FIG. 19, reference numeral 1 denotes an electron gun made up of a cathode 1a, grid 1b, and anode 1c. Electrons emitted by the cathode 1a form a crossover image between the grid 1b and anode 1c. The crossover image will be referred to as an electron source hereinafter.

Electrons coming from this electron source are converted into nearly collimated electron beams by an illumination electron optical system 2 whose front-side focal point position is located at the electron source position. The nearly collimated electron beams are irradiated onto an elementary optical system array 3. The illumination electron optical system 2 is made up of electron lenses 2a, 2b, and 2c. By adjusting the electron optical powers (focal lengths) of at least two of the electron lenses 2a, 2b, and 2c, the focal length of the illumination electron optical system 2 can be changed while holding its focal point position on the electron source side. In other words, the focal length of the illumination electron optical system 2 can be changed while obtaining nearly collimated electron beams from the illumination electron optical system 2.

The nearly collimated electron beams coming from the illumination electron optical system 2 enter an elementary optical system array 3. The elementary electron optical system array 3 is formed by two-dimensionally arranging a plurality of elementary electron optical systems, each consisting of an aperture, electron lens, and blanking electrode, in directions perpendicular to an optical axis AX. The elementary electron optical system 3 has an arrangement as shown in FIGS. 2A and 2B. However, in this embodiment, the matrix of elementary electron optical systems is different from that in FIGS. 2A and 2B, as will be described later.

The elementary electron optical system array 3 is made up of a matrix of a plurality of elementary electron optical systems shown in FIGS. 3 and 4, and these elementary electron optical systems form a plurality of intermediate images of the electron source. The intermediate images are projected in a reduced scale by a reduction electron optical system 4, and form images of the electron source on a wafer 5. Note that the size Wm of the intermediate image of the electron source is given by:

$$Wm = Ws \times Fe/Fi$$

where Ws is the size of the electron source, Fi is the focal length of the illumination electron optical system 2, and Fe is the focal length of each electron optical system of the elementary electron optical system.

Hence, when the focal length of the illumination electron optical system 2 is changed, the sizes of the plurality of intermediate images of the electron source can be changed at the same time, and the sizes of a plurality of electron source images on the wafer 5 can also be changed at the same time. Furthermore, the elementary electron optical system array 3 makes the positions of the individual intermediate images differ in the optical axis direction in correspondence with the curvature of field of the reduction electron optical system 4, and corrects in advance any aberrations expected to be produced when the individual intermediate images are projected onto the wafer 5 in a reduced scale by the reduction electron optical system 4.

The reduction electron optical system 4 comprises a symmetric magnetic doublet consisting of a first projection lens 41 (43) and second projection lens 42 (44). If f1 represents the focal length of the first projection lens 41 (43), and f2 represents the focal length of the second projection lens 42 (44), the distance between these two lenses is f1+f2. The object point on the optical axis AX is located at the focal point position of the first projection lens 41 (43), and its image point is formed at the focal point of the second projection lens 42 (44). This image is reduced to −f2/f1. Since two lens magnetic fields are determined to act in opposite directions, the Seidel aberrations and chromatic aberrations pertaining to rotation and magnification theoretically cancel each other, except for five aberrations, i.e., spherical aberration, isotropic astigmatism, isotropic coma, curvature of field, and on-axis chromatic aberration.

Reference numeral 6 denotes a drawing deflector for deflecting a plurality of electron beams coming from the elementary electron optical system array 3 to displace a plurality of electron source images by nearly equal deflection amounts in the X- and Y-directions on the wafer 5. The drawing deflector 6 comprises a main deflector 61 which has a large deflection width but requires a long time until settlement, i.e., a long settlement wait time, and a sub deflector 62 which has a small deflection width but requires only a short settlement wait time. The main deflector 61 is an electromagnetic type deflector, and the sub deflector 62 is an electrostatic type deflector.

Reference symbol SDEF denotes a stage tracing deflector for making a plurality of electron beams coming from the elementary electron optical system array 3 trace the continuous movement of the X-Y stage 12. The stage tracing deflector SDEF comprises an electrostatic type deflector.

Reference numeral 7 denotes a dynamic focus coil that corrects any deviations of the focus positions of the electron source images arising from deflection aberration produced upon operation of the drawing deflector 6; and 8, a dynamic stigmatic coil that corrects astigmatism of deflection aberration produced upon deflection as in the dynamic focus coil 7.

Reference numeral 9 denotes a refocus coil for adjusting the focal point position of the reduction electron optical system 4 to correct blurring of electron beams due to the Coulomb effect when the number of a plurality of electron beams to be irradiated onto the wafer or the sum total of currents to be irradiated onto the wafer becomes large.

Reference numeral 10 denotes a Faraday cup having two single knife edges respectively extending in the X- and Y-directions. The Faraday cup detects the charge amount of electron source images formed by the electron beams coming from the elementary electron optical systems.

Reference numeral 11 denotes a θ-Z stage that carries a wafer, and is movable in the direction of the optical axis AX (Z-axis) and in the direction of rotation about the Z-axis. A stage reference plate 13 and the Faraday cup 10 are fixed on the stage 11.

Reference numeral 12 denotes an X-Y stage which carries the θ-Z stage and is movable in the X- and Y-directions perpendicular to the direction of the optical axis AX (Z-axis).

FIG. 3 is a sectional view of each elementary electron optical system.

Referring to FIG. 3, a substrate AP-P is irradiated with electron beams nearly collimated by the illumination electron optical system 2. The substrate AP-P has an aperture (AP1) that defines the shape of electron beams to be transmitted, and is common to other elementary electron optical systems. That is, the substrate AP-P is a substrate having a plurality of apertures.

Reference numeral 301 denotes a blanking electrode which is made up of a pair of electrodes and has a deflection function; and 302, a substrate which has an aperture (AP2) larger than the aperture (AP1) and is common to other elementary electron optical systems. On the substrate 302, the blanking electrode 301 and wiring (W) for turning on/off the electrodes are formed. That is, the substrate 302 has a plurality of apertures and a plurality of blanking electrodes.

Reference numeral 303 denotes an electron optical system, which uses two unipotential lenses 303*a* and 303*b*. Each unipotential lens is made up of three aperture electrodes, and has a convergence function by setting the upper and lower electrodes at the same potential as an acceleration potential V0, and keeping the intermediate electrode at another potential V1 or V2. The individual aperture electrodes are stacked on a substrate via insulating materials, and the substrate is common to other elementary electron optical systems. That is, the substrate has a plurality of electron optical systems 303.

The upper, intermediate, and lower electrodes of the unipotential lens 303*a* and the upper and lower electrodes of the unipotential lens 303*b* have a shape shown in FIG. 4A, and the upper and lower electrodes of the unipotential lenses 303*a* and 303*b* are set at a common potential in all the elementary electron optical systems by a first focal point astigmatism control circuit 15 (to be described later).

Since the potential of the intermediate electrode of the unipotential lens 303*a* can be set by the first focal point astigmatism control circuit 15 in units of elementary electron optical systems, the focal length of the unipotential lens 303a can be set in units of elementary electron optical systems.

The intermediate electrode of the unipotential lens 303b is made up of four electrodes, as shown in FIG. 4B, and the potentials of these electrodes can be set independently and also individually in units of elementary electron optical systems by the first focal point-astigmatism control circuit 15. Hence, the unipotential lens 303b can have different focal lengths in a section perpendicular to its optical axis and can set them individually in units of elementary electron optical systems.

As a consequence, by respectively controlling the potentials of the intermediate electrodes of the electron optical systems 303, the electron optical characteristics (the intermediate image forming positions and astigmatism) of the elementary electron optical systems can be controlled. Upon controlling the intermediate image forming positions, since the size of each intermediate image is determined by the ratio between the focal lengths of the illumination electron optical system 2 and each electron optical system 303, the intermediate image forming position is moved by setting a constant focal length of each electron optical system 303 and moving its principal point position. With this control, the intermediate images formed by all the elementary electron optical systems can have nearly equal sizes and different positions in the optical axis direction.

Each nearly collimated electron beam output from the illumination electron optical system 2 forms an intermediate image of the electron source via the aperture (AP1) and electron optical system 303. Note that the aperture (AP1) is located at or in the vicinity of the front-side focal point position of the corresponding electron optical system 303, and the blanking electrode 301 is located at or in the vicinity of the intermediate image forming position (rear-side focal point position) of the corresponding electron optical system 303. For this reason, if no electric field is applied across the electrodes of the blanking electrode 301, the electron beam is not deflected, as indicated by an electron beam 305 in FIG. 3. On the other hand, if an electric field is applied across the electrodes of the blanking electrode 301, the electron beam is deflected, as indicated by an electron beam 306 in FIG. 3. Since the electron beams 305 and 306 have different angle distributions on the object plane of the reduction electron optical system 4, they become incident on different regions at the pupil position (on a plane P in FIG. 19) of the reduction electron optical system 4. Hence, a blanking aperture BA that transmits the electron beam 305 alone is formed at the pupil position (on the plane P in FIG. 19) of the reduction electron optical system.

The electron lenses (electron optical systems 303) of the elementary electron optical systems individually set the potentials of their two intermediate electrodes so as to correct the curvature of field and astigmatism produced when the intermediate images formed thereby are projected in a reduced scale onto the surface to be exposed by the reduction electron optical system 4, thereby making the electron optical characteristics (intermediate image forming positions and astigmatism) of the elementary electron optical systems different. However, in this embodiment, in order to decrease the number of wiring lines between the intermediate electrodes and the first focal point astigmatism control circuit 15, the elementary electron optical systems included in a single subarray have identical electron optical characteristics, and the electron optical characteristics (intermediate image forming positions and astigmatism) of the elementary electron optical systems are controlled in units of subarrays.

Furthermore, in order to correct distortion produced when a plurality of intermediate images are projected in a reduced scale onto the surface to be exposed by the reduction electron optical system 4, the distortion characteristics of the reduction electron optical system 4 are detected in advance, and the positions of the elementary electron optical systems in directions perpendicular to the optical axis of the reduction electron optical system 4 are set based on the detected characteristics.

Figure 20:
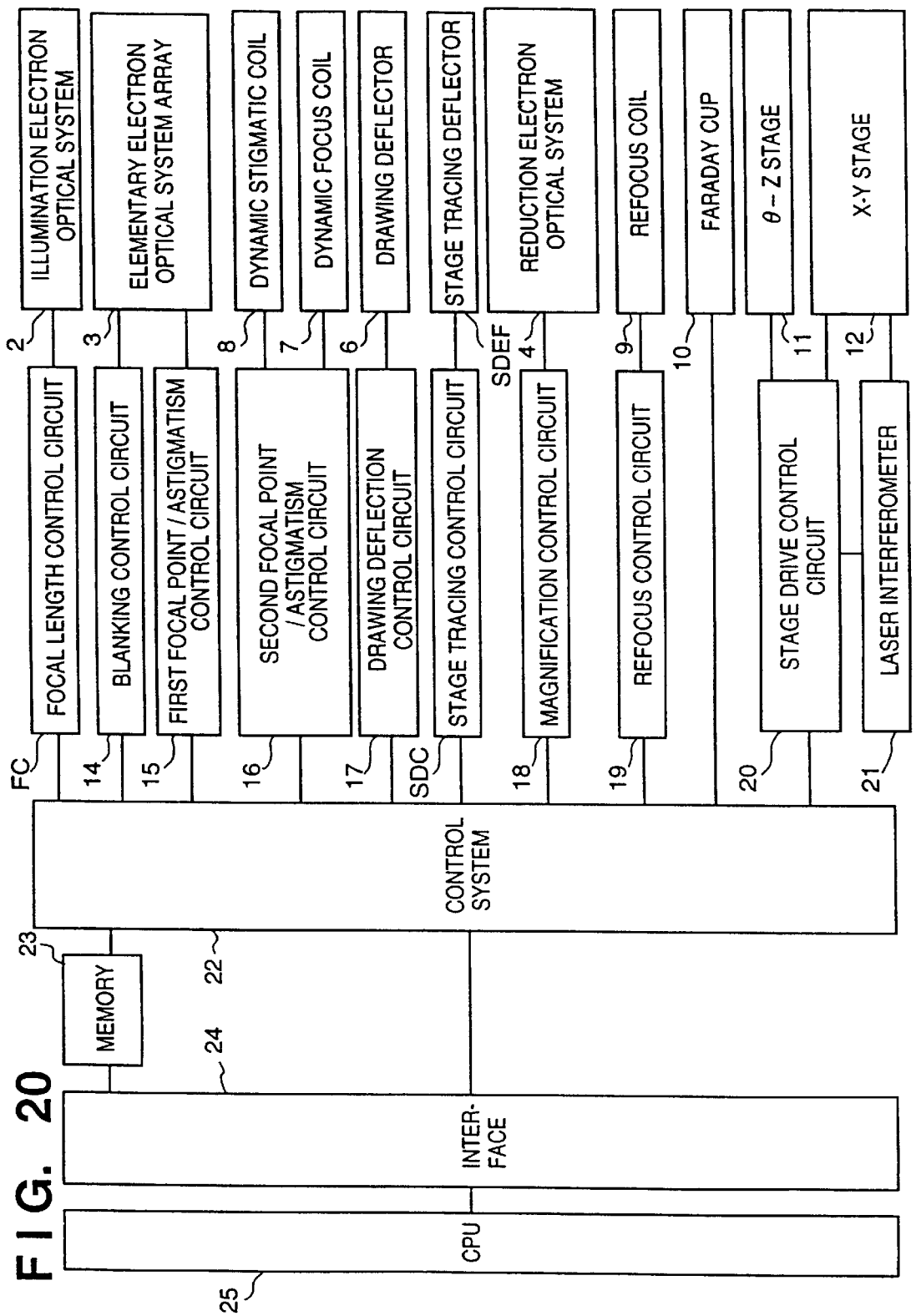
FIG. 20 is a block diagram for explaining the system arrangement according to the present invention.

FIG. 20 shows the system arrangement of this embodiment.

A focal length control circuit FC controls the focal length of the illumination electron optical system 2 while holding its focal point position on the electron source side, by adjusting the electron optical powers (focal lengths) of at least two of the electron lenses 2a, 2b, and 2c of the illumination electron optical system 2.

A blanking control circuit 14 individually ON/OFF-controls the blanking electrodes of the elementary electron optical systems in the elementary electron optical system array 3, and the first focal point astigmatism control circuit 15 individually controls the electron optical characteristics (intermediate image forming positions and astigmatism) of the elementary electron optical systems in the elementary electron optical system array 3.

A second focal point astigmatism control circuit 16 controls the focal point position and astigmatism of the reduction electron optical system 4 by controlling the dynamic stigmatic coil 8 and dynamic focus coil 7. A drawing deflection control circuit 17 controls the drawing deflector 6. A stage tracing control circuit SDC controls the stage tracing deflector SDEF to make electron beams trace the continuous movement of the X-Y stage 12. A magnification adjustment circuit 18 adjusts the magnification of the reduction electron optical system 4. A refocus control circuit 19 adjusts the focal point position of the reduction electron optical system 4 by controlling the currents to be supplied to the refocus coil 9.

A stage drive control circuit 20 controls driving of the θ-Z stage, and also controls driving of the X-Y stage 12 in collaboration with a laser interferometer 21 that detects the position of the X-Y stage 12.

A control system 22 synchronously controls the above-mentioned control circuits, refocus coil 9, and Faraday cup 10 to attain exposure and alignment based on exposure control data from a memory 23. The control system 22 is controlled by a CPU 25 for controlling the entire electron beam exposure apparatus via an interface 24.

(Explanation of Operation)

Exposure of the electron beam exposure apparatus of this embodiment will be explained below with the aid of FIG. 21.

The control system 22 directs the deflection control circuit 17 based on the exposure control data from the memory 23 to deflect a plurality of electron beams from the elementary electron optical system array by the sub deflector 62 of the drawing deflector 6. Also, the control system 22 directs the blanking control circuit 14 to turn on/off the blanking electrodes of the respective elementary electron optical systems in accordance with the pattern to be formed by exposure on the wafer 5. At this time, since the X-Y stage 12 is continuously moving in the X-direction, the control system 22 directs the stage tracing control circuit SDC to deflect the plurality of electron beams by the stage tracing deflector SDEF, so that the electron beams trace the movement of the X-Y stage. An electron beam coming from one elementary electron optical system scans and exposes an exposure field (EF) on the wafer 5, as shown in FIG. 21. In this embodiment, Sx=Sy=4 μm. Since the plurality of elementary electron optical systems of the elementary electron optical system array are set to form their elementary exposure fields (EF) to be two-dimensionally adjacent to each other on the wafer 5, a subfield (SF) made up of a plurality of elementary exposure fields (EF) is exposed on the wafer 5 simultaneously. In this embodiment, the elementary electron optical system array 3 is configured to form an M=64 (X-direction)×N=64 (Y-direction) matrix of a plurality of elementary exposure fields (EF), and the subfield (SF) has a size of 256×256 ($\mu$m$^2$).

Figure 21:
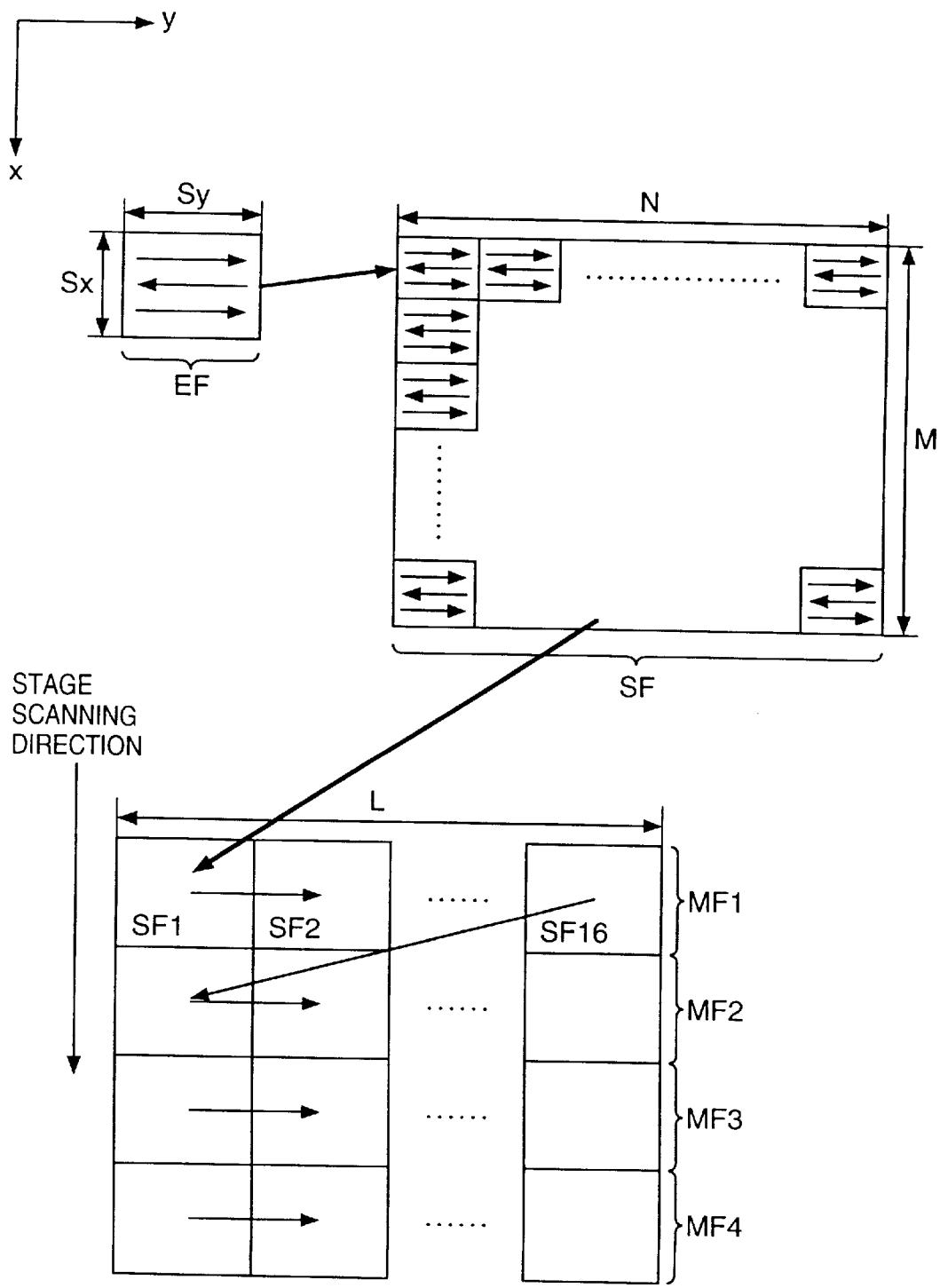
FIG. 21 is a view for explaining elementary exposure fields (EF), subfields (SF), and main fields (MF)

The control system 22 directs the drawing deflection control circuit 17 to deflect a plurality of electron beams coming from the elementary electron optical system array in a direction perpendicular to the stage scanning direction using the main deflector 61 of the drawing deflector 6 so as to expose subfield 2 (SF2) after exposure of subfield 1 (SF1) shown in FIG. 21. Again, as described above, the control system 22 directs the drawing deflection control circuit 17 to deflect a plurality of electron beams coming from the elementary electron optical system array by the sub deflector 62 of the drawing deflector 6, and directs the blanking control circuit 14 to turn on/off the blanking electrodes of the respective elementary electron optical systems in accordance with the pattern to be formed by exposure on the wafer 5, thus exposing subfield 2 (SF2). The subfields (SF1 to SF16) are then exposed in turn, as shown in FIG. 21, thus forming the pattern on the wafer 5. As a result, a main field (MF) made up of subfields (SF1 to SF16) aligned in a direction perpendicular to the stage scanning direction is exposed on the wafer 5. In this case, a line of L=16 subfields (SF) is formed in the Y-direction, and the main field (MF) has a size of 256×4,096 ($\mu$m$^2$).

After exposure of main field 1 (MF1) shown in FIG. 21, the control system 22 directs the drawing deflection control circuit 17 to deflect a plurality of electron beams coming from the elementary electron optical system array in turn to each of main fields (MF2, MF3, MF4, . . . ) aligned in the stage scanning direction, thereby forming patterns on the wafer 5 by exposure.

More specifically, the electron beam exposure apparatus of this embodiment deflects a plurality of electron beams on the wafer while continuously moving the stage that carries the wafer, and individually ON/OFF-controls the electron beams in units of deflection positions, thereby drawing a subfield made up of a plurality of elementary exposure fields by drawing patterns on the elementary exposure fields in units of electron beams, drawing a main field made up of a plurality of subfields by sequentially drawing the subfields aligned in a direction perpendicular to the continuous moving direction, and sequentially drawing a plurality of main fields aligned in the continuous moving direction.

(Explanation of Generation of Exposure Control Data)

The method of generating exposure control data of the electron beam exposure apparatus of this embodiment will be explained below.

Figure 22:
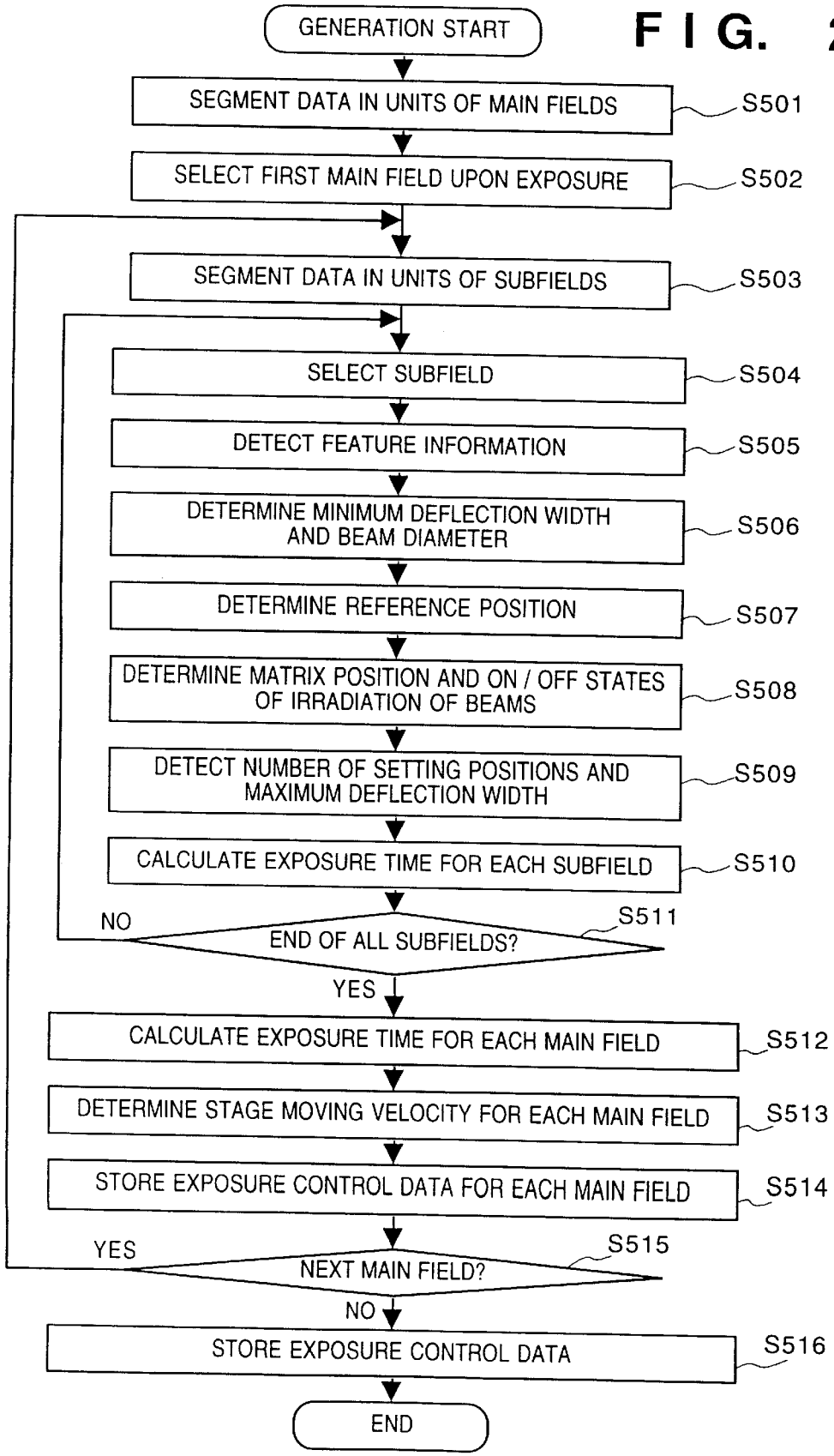
FIG. 22 is a flow chart for explaining generation of exposure control data.

Upon reception of pattern data to be formed by exposure on the wafer, the CPU 25 executes processing for generating exposure control data, as shown in FIG. 22.

The respective steps will be described.

(Step S501)

The input pattern data is segmented into data in units of main fields defined by the electron beam exposure apparatus of this embodiment.

(Step S502)

A main field to be exposed first in exposure is selected.

(Step S503)

The pattern data of the selected main field is segmented into data in units of subfields defined by the electron beam exposure apparatus of this embodiment.

(Step S504)

One subfield is selected.

(Step S505)

Feature information (e.g., the minimum line width, type of line width, shape) of a pattern is detected from the pattern data of the selected subfield. In this embodiment, the minimum line width is detected.

(Step S506)

The minimum deflection width and electron beam diameter (the size of an electron source image to be imaged on the wafer) that the sub deflector 62 gives to an electron beam are determined based on the detected pattern information. In this embodiment, the minimum deflection width is determined so that an integer multiple of the minimum deflection width agrees with the matrix pitch (on the wafer) of a plurality of electron beams and approximately ¼ the minimum line width. Also, the electron beam diameter is determined to be nearly equal to that of a circumscribed circle of a square having one side equal to the minimum deflection width.

(Step S507)

A deflection position (reference position) defined by the main deflector 61 upon exposing the selected subfield is determined.

(Step S508)

The pattern data of the selected subfield is segmented into pattern data in units of elementary exposure fields corresponding to the elementary electron optical systems, and a common matrix made up of matrix elements FME using the determined minimum deflection amount of the sub deflector 62 as a matrix spacing is set, thus converting the pattern data into those expressed on the common matrix in units of elementary electron optical systems. The processing pertaining to pattern data upon exposure using two elementary electron optical systems a and b will be described below for the sake of simplicity.

FIGS. 10A and 10B show patterns Pa and Pb to be formed by exposure by the neighboring elementary electron optical systems a and b on a common deflection matrix DM. Each elementary electron optical system irradiates an electron beam onto the wafer by turning off its blanking electrode at hatched matrix positions with pattern portions. For this purpose, the CPU 25 determines first regions FF (solid black portions) consisting of matrix positions corresponding to exposure positions of at least one of the elementary electron optical systems a and b, and second regions NN (blank portions) consisting of matrix positions when neither of the elementary electron optical systems a and b commonly perform exposure, as show in FIG. 10C, on the basis of the matrix position data to be exposed in units of elementary electron optical systems shown in FIGS. 10A and 10B. When a plurality of electron beams are located on the first region FF on the matrix, exposure is done by deflecting and settling the electron beams by the deflector 6 in units of minimum deflection amounts (the matrix spacings), thus forming all the patterns to be drawn on the wafer by exposure. When a plurality of electron beams are located on the second region NN on the matrix, they are deflected without settling their positions, thereby attaining exposure while eliminating unnecessary deflection of the electron beams and unnecessary control data. In other words, after exposure of the first region (FF), when the electron beams are deflected to expose the next first region (FF) while skipping the second region (NN), the number of times of deflection that requires a long settling time can be reduced, and exposure can be attained within a shorter period of time. Subsequently, the CPU 25 determines the matrix positions of matrix elements to be exposed on the basis of data pertaining to the regions FF and NN shown in FIG. 10C. Also, the CPU 25 determines the ON/OFF patterns of blanking electrodes corresponding to the matrix positions to be settled of the electron beams in units of elementary electron optical systems on the basis of data representing the patterns shown in FIGS. 10A and 10B. Since the minimum deflection width and the deflection order in that matrix have already been determined, and matrix numbers are assigned in advance to the respective matrix elements, the matrix numbers are determined to be the matrix positions.

(Step S509)

The number of settling positions (the number of times of settlement) and the maximum deflection width from one settling position to the next one of the sub deflector 62 are detected from the data obtained in step S508.

(Step S510)

The exposure time for the selected subfield is calculated. The deflection cycle of the sub deflector 62 upon exposing the subfield is constant, and if Ts (sec) represents the settling time of the electron beam at the deflection position (so-called exposure time), and To represents the maximum settling wait time in the subfield until the electron beam is deflected and settles to a desired deflection position, the deflection cycle Td (sec) of the sub deflector 62 is given by Td=Ts+To. The settling wait time becomes longer as the deflection width is larger. Hence, in this step, the settling wait time To upon exposing the subfield based on the detected maximum deflection width is obtained based on the relationship between the maximum deflection width and settling wait time, which is obtained by, e.g., experiments, and the deflection cycle Td (sec) is then calculated. The exposure time Tsub of the selected subfield is calculated by the equation below based on the detected number N of settling positions:

$$Tsub=Td\times N.$$

(Step S511)

It is checked if the processing in steps S505 to S510 is complete for all the subfields in the selected main field. If non-processed subfields remain, the flow returns to step S504 to select the next non-processed subfield; otherwise, the flow advances to step S512.

(Step S512)

The exposure times of the subfields in the selected main field are added to each other to calculate the exposure time of the selected main field.

(Step S513)

Figure 23A:
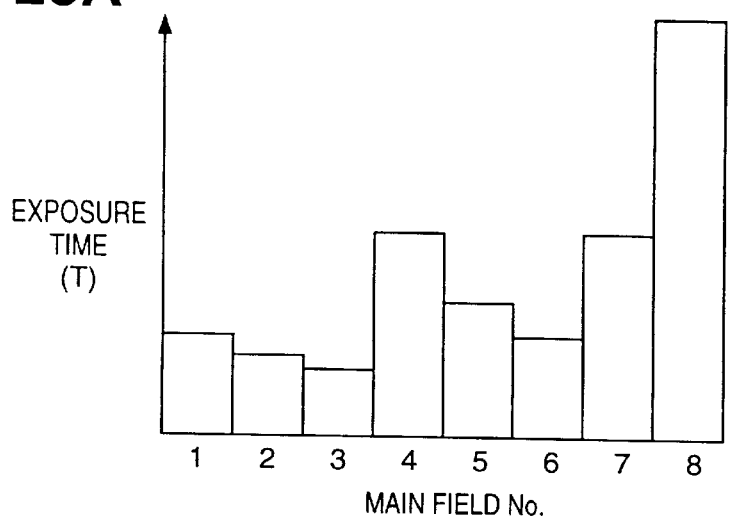
FIGS. 23A to 23C are graphs for explaining the relationship between the exposure time and stage moving velocity in units of main fields.
Figure 23B:
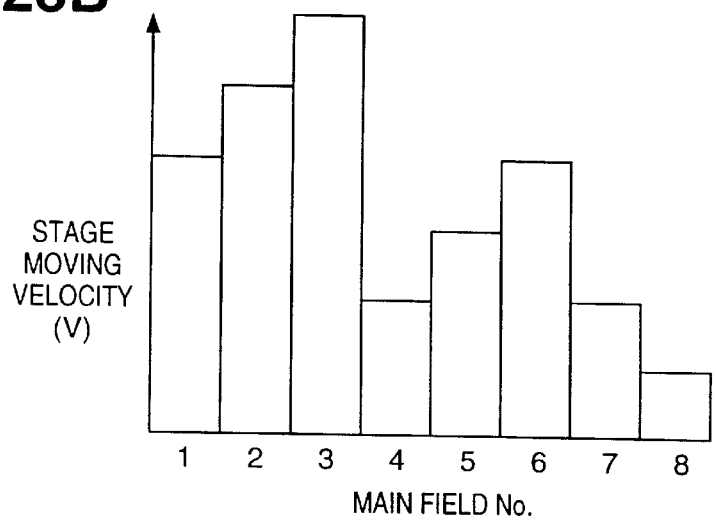

The moving velocity of the stage upon exposing each main field is determined on the basis of the calculated exposure time of each main field. FIG. 23A shows an example of the relationship between the main fields (MF(N)) and exposure times (T(n)). As shown in FIG. 23A, when the minimum deflection width is switched based on the pattern data of the corresponding main field in units of main fields upon exposing a plurality of main fields, the exposure times of the main fields are often different from each other. Hence, in this embodiment, the moving velocity (V(n)) of the X-Y stage 12 is determined to be inversely proportional to the exposure time. For example, since the width (LMF) of the main field in the moving direction of the X-Y stage 12 is 256 µm, if the exposure time T(n)=2.56 ms, the stage moving velocity V(n)=100 mm/s (=LMF/T(n)). FIG. 23B shows this relationship between the main fields and stage moving velocities. As described above, since exposure is done at the stage moving velocity for each main field in accordance with the exposure time of each main field, the wafer can be exposed within a shorter period of time. This is because when the stage is controlled at equal speed like in a conventional multi-electron beam type exposure apparatus, exposure for a main field with a short exposure time can be done within a short period of time, but exposure must be interrupted until the next main field moves to the deflection range of the main deflector 61, so as to expose the next main field. However, the present invention does not require any interruption time.

(Step S514)

The stage moving velocity of the selected main field, the reference positions defined by the main deflector 61, minimum deflection width, and beam diameter in units of subfields in the selected main field, the deflection cycle of the sub deflector 62, the matrix positions defined by the sub deflector 62, and data pertaining to the ON/OFF states of electron beams of the elementary electron optical systems at the matrix positions are stored.

(Step S515)

If there is a next main field, that main field is selected, and the flow returns to step S503. If there is no main field to be exposed next upon exposure, the flow advances to step S516.

(Step S516)

Exposure control data is stored. As shown in FIG. 24, the exposure control data contains, as elements, the stage moving velocities in units of main fields, the reference positions defined by the main deflector 61 in units of subfields, the minimum deflection width of the sub deflector 61, the electron beam diameter, the deflection cycle of the sub deflector 62, the matrix positions defined by the sub deflector 62, and data pertaining to the ON/OFF states of electron beams of the elementary electron optical systems at the matrix positions.

In this embodiment, the above-mentioned processing steps are implemented by the CPU 25 of the electron beam exposure apparatus but may be implemented by another processing device, and the obtained exposure control data may be transferred to the CPU 25 to achieve the above objective and to obtain the same effects as above.

(Explanation of Exposure Based on Exposure Control Data)

Figure 25:
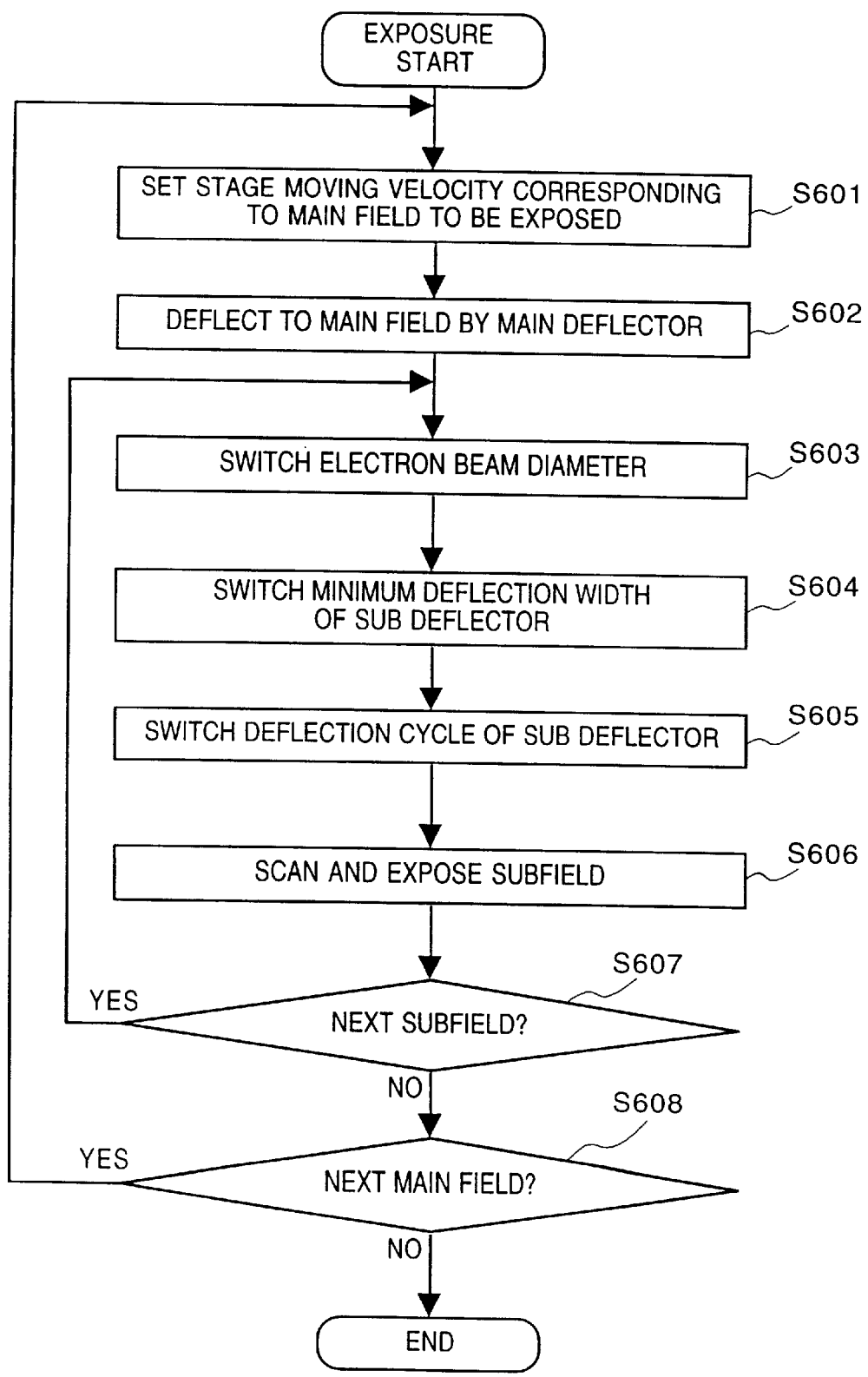
FIG. 25 is a flow chart for explaining exposure based on the exposure control data.

When the CPU 25 instructs the control system 22 to "execute exposure" via the interface 24, the control system 22 executes the steps shown in FIG. 25 on the basis of the exposure control data on the memory 23 in response to this instruction.

The individual steps will be explained below.

(Step S601)

The control system 22 directs the stage drive control circuit 20 to switch the moving velocity of the X-Y stage 12 to that corresponding to the main field to be exposed, thus controlling the X-Y stage 12.

(Step S602)

The control system 22 directs the drawing deflection control circuit 17 to deflect a plurality of electron beams coming from the elementary electron optical system array to the subfield to be exposed by the main deflector 61, so that the electron beams are located at reference positions upon exposing the first subfield of the main field to be exposed.

(Step S603)

The control system 22 directs the focal length control circuit FC to change the focal length of the illumination electron optical system 2, thus switching the electron beam diameter to that corresponding to the subfield to be exposed.
(Step S604)
The control system 22 instructs the drawing deflection control circuit 17 to switch the minimum deflection width of the sub deflector 61 to that corresponding to the subfield to be exposed.
(Step S605)
The control system 22 directs the drawing deflection control circuit 17 to switch the deflection cycle of the sub deflector 62 to that corresponding to the subfield to be exposed. Furthermore, a cycle signal defined by the deflection cycle is generated.
(Step S606)
The control system 22 directs the drawing deflection control circuit 17 to deflect a plurality of electron beams coming from the elementary electron optical system array by the sub deflector 62 to the deflection positions defined by the exposure control data in units of switched minimum deflection widths in synchronism with the cycle signal. At the same time, the control system 22 directs the blanking control circuit 14 to turn on/off the blanking electrodes of the elementary electron optical systems in accordance with the pattern to be formed by exposure on the wafer 5. Furthermore, in order to correct blurring of electron beams due to the Coulomb effect, the control system 22 directs the refocus control circuit 19 to adjust the focal point position of the reduction electron optical system 4 by the refocus coil 9 on the basis of the number of electron beams to be irradiated onto the wafer without being intercepted by the blanking electrodes. At this time, the X-Y stage 12 is continuously moving in the X-direction, and the drawing deflection control circuit 17 controls the deflection positions of the electron beams in consideration of the moving amount of the X-Y stage 12. As a result, the electron beam from each elementary electron optical system scans and exposes an elementary exposure field (EF) on the wafer 5, as shown in FIG. 21. Since exposure fields (EF) of the plurality of elementary electron optical systems of the elementary electron optical system array are set two-dimensionally adjacent to each other, a subfield (SF) made up of a plurality of elementary exposure fields (EF), which form a two-dimensional matrix and are exposed at the same time, is exposed on the wafer 5.
(Step S607)
If the next subfield to be exposed remains, the flow returns to step S603; otherwise, the flow advances to step S608.
(Step S608)
If the next main field to be exposed remains, the flow returns to step S601; otherwise, exposure is to end.
<Modification>
In the above embodiment, the stage moving velocity for each main field is determined to be inversely proportional to the exposure time required for exposing that main field. However, when the difference between the determined moving velocities of neighboring main fields in the continuous moving direction is large, an excessive acceleration is given to the stage. As a consequence, it becomes hard to control the stage, and the position stability of the stage deteriorates. To solve this problem, in this modification, the higher moving velocity of neighboring main fields is re-determined to be lower than the determined moving velocity, so that the difference between the determined moving velocities of neighboring main fields in the continuous moving direction becomes equal to or smaller than a predetermined value (Vp).
This processing will be explained in detail below with reference to FIG. 24.

Figure 23C:
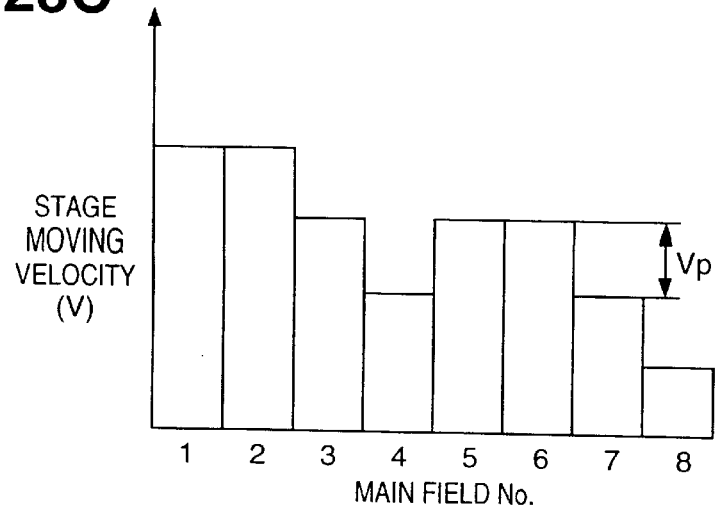
Figure 26:
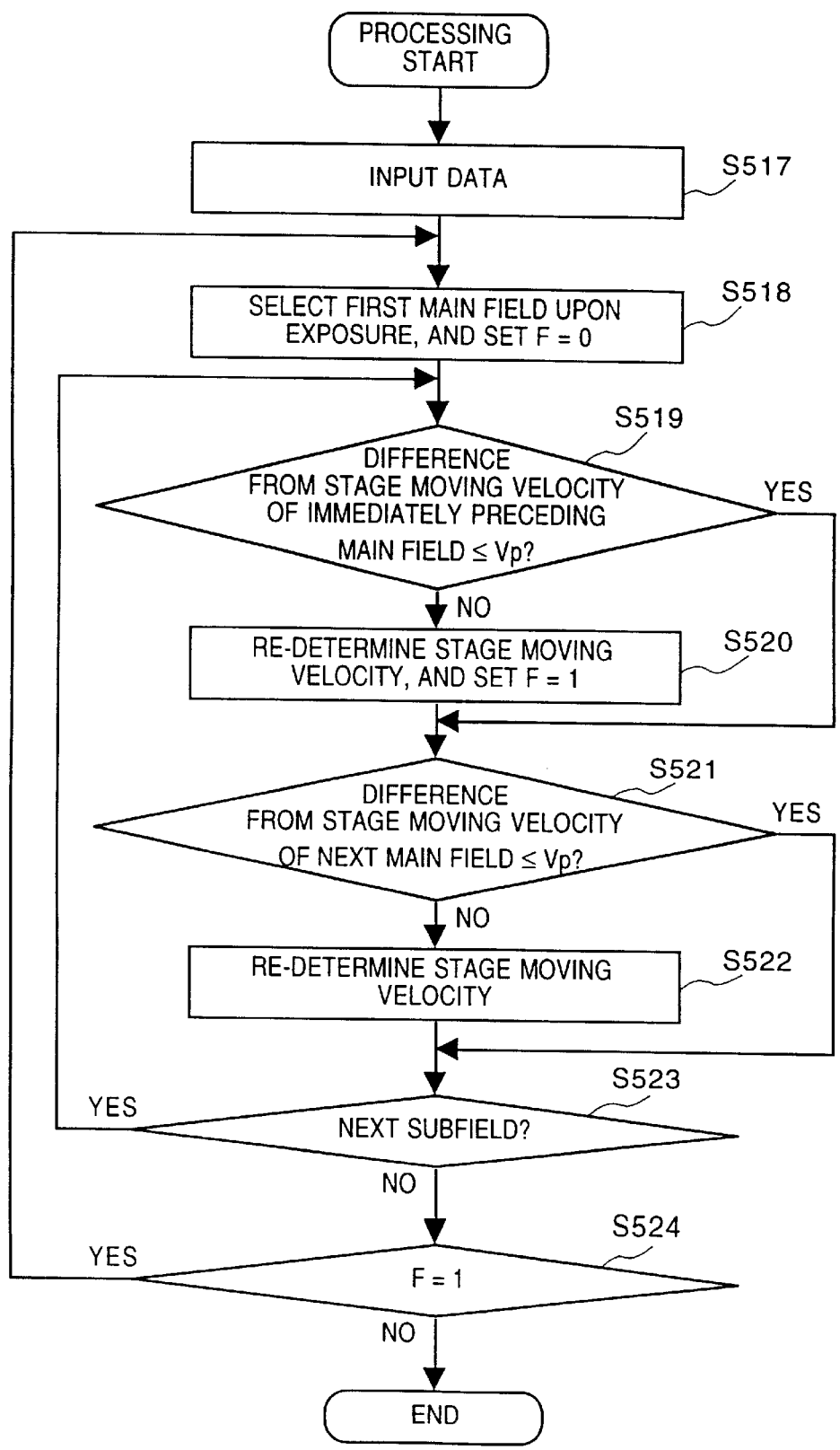
FIG. 26 is a flow chart for explaining the method of re-determining the stage moving velocity in units of main fields.
Figure 27:
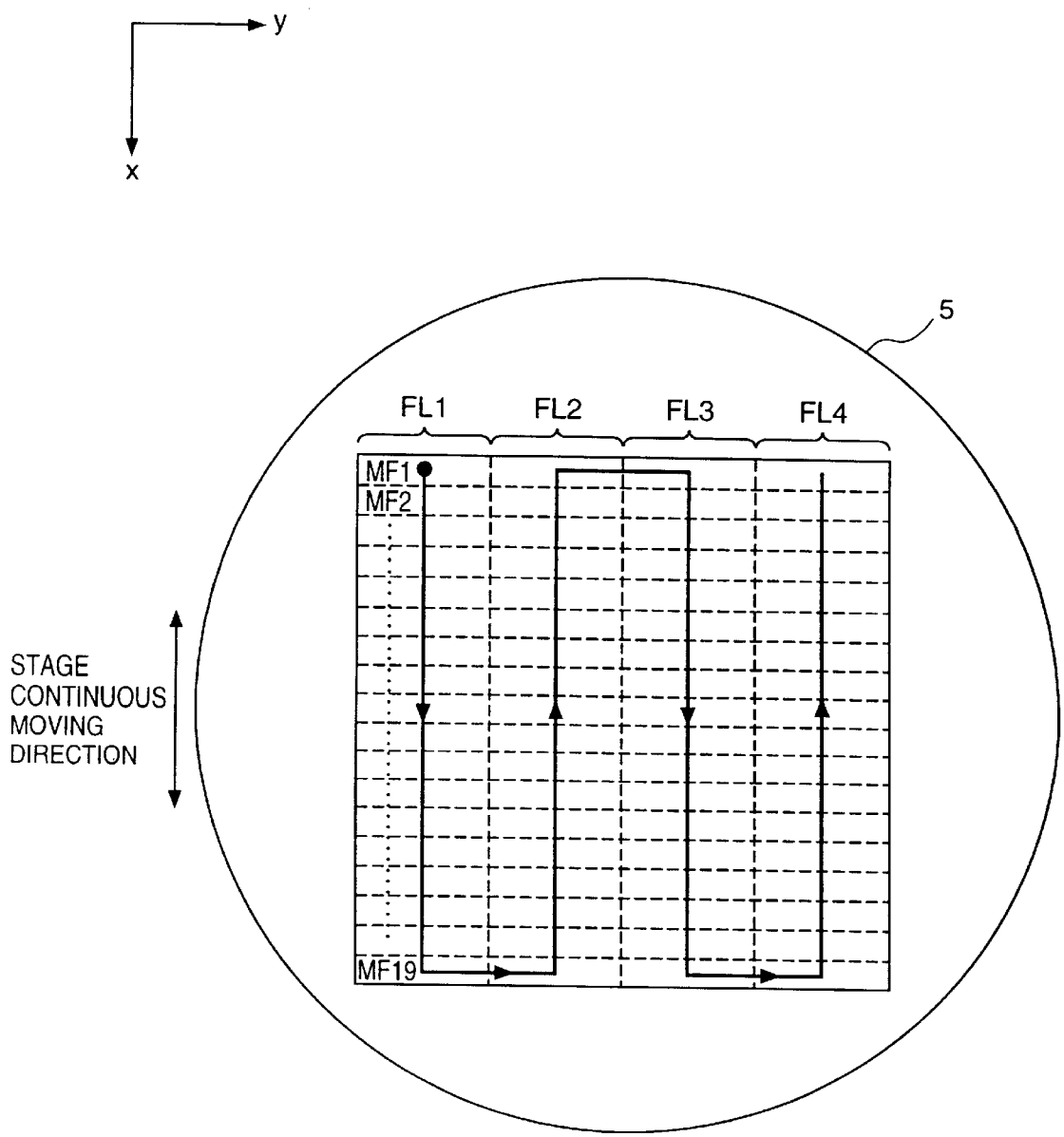
FIG. 27 is a view for explaining a matrix of frames.

(Step S517)
Data indicating the relationship (FIG. 23B) between the main fields and moving velocities of the X-Y stage 12 determined in step S513 in the flow chart of FIG. 22 is input.
(Step S518)
The main field to be exposed first upon exposure is selected. A re-determination flag F is set at F=0.
(Step S519)
The difference between the moving velocity of the X-Y stage 12 upon exposing the selected main field, and that of the X-Y stage 12 upon exposing the main field to be exposed immediately before exposure of the selected main field is calculated (if there is no immediately preceding main field, the flow jumps to step S521). If the calculated difference is not equal to or smaller than a predetermined value (Vp) that can assure controllability and safety of the X-Y stage 12, the flow advances to step S520; otherwise, the flow jumps to step S521.
(Step S520)
The moving velocity of the X-Y stage 12 upon exposing the main field corresponding to the higher moving velocity is re-determined, so that the moving velocity difference becomes equal to or smaller than the predetermined value (Vp). Also, the re-determination flag F is set at F=1.
(Step S521)
The difference between the moving velocity of the X-Y stage 12 upon exposing the selected main field, and that of the X-Y stage 12 upon exposing the main field to be exposed immediately after exposure of the selected main field is calculated (if there is no next main field, the flow jumps to step S523). If the calculated difference is not equal to or smaller than the predetermined value (Vp), the flow advances to step S522; otherwise, the flow advances to step S523.
(Step S522)
The moving velocity upon exposing the main field corresponding to the higher moving velocity is re-determined, so that the moving velocity difference becomes equal to or smaller than the predetermined value (Vp).
(Step S523)
The main field to be exposed immediately after exposure of the selected main field is selected, and the flow returns to step S519. If there is no next main field, the flow advances to step S524.
(Step S524)
If the re-determination flag F is F=1, the flow returns to step S518. If the re-determination flag F is F=0, the processing ends.
FIG. 23C shows the relationship between the main fields and stage moving velocities obtained as a processing result of the above-mentioned processing shown in FIG. 26.
<Second Modification>
In this modification, as shown in FIG. 27, the exposure region on the wafer 5 is defined as follows. That is, a frame (FL1) made up of a plurality of main fields aligned in the continuous moving direction is exposed, and the X-Y stage 12 is stepped in the Y-direction. Then, the continuous moving direction of the X-Y stage 12 is reversed to expose the next frame (FL2). That is, frames aligned in a direction perpendicular to the continuous moving direction of the X-Y stage 12 are exposed in turn.
In the second embodiment, the moving velocities of the X-Y stage 12 are determined in units of main fields. However, in this modification,. the moving velocities of the X-Y stage 12 are determined in units of frames. More specifically, the moving velocity of the X-Y stage in each frame is determined on the basis of the longest exposure time of those of the main fields that make up the frame. Upon switching the frame to be drawn, the moving velocity of the X-Y stage is switched to the next determined velocity, and patterns are drawn by moving the X-Y stage at a constant moving velocity in the frame.

[Explanation of a Method of Manufacturing a Device of the Present Invention]

An embodiment of a device manufacturing method using the above-mentioned electron beam exposure apparatus will be explained below.

Figure 13:
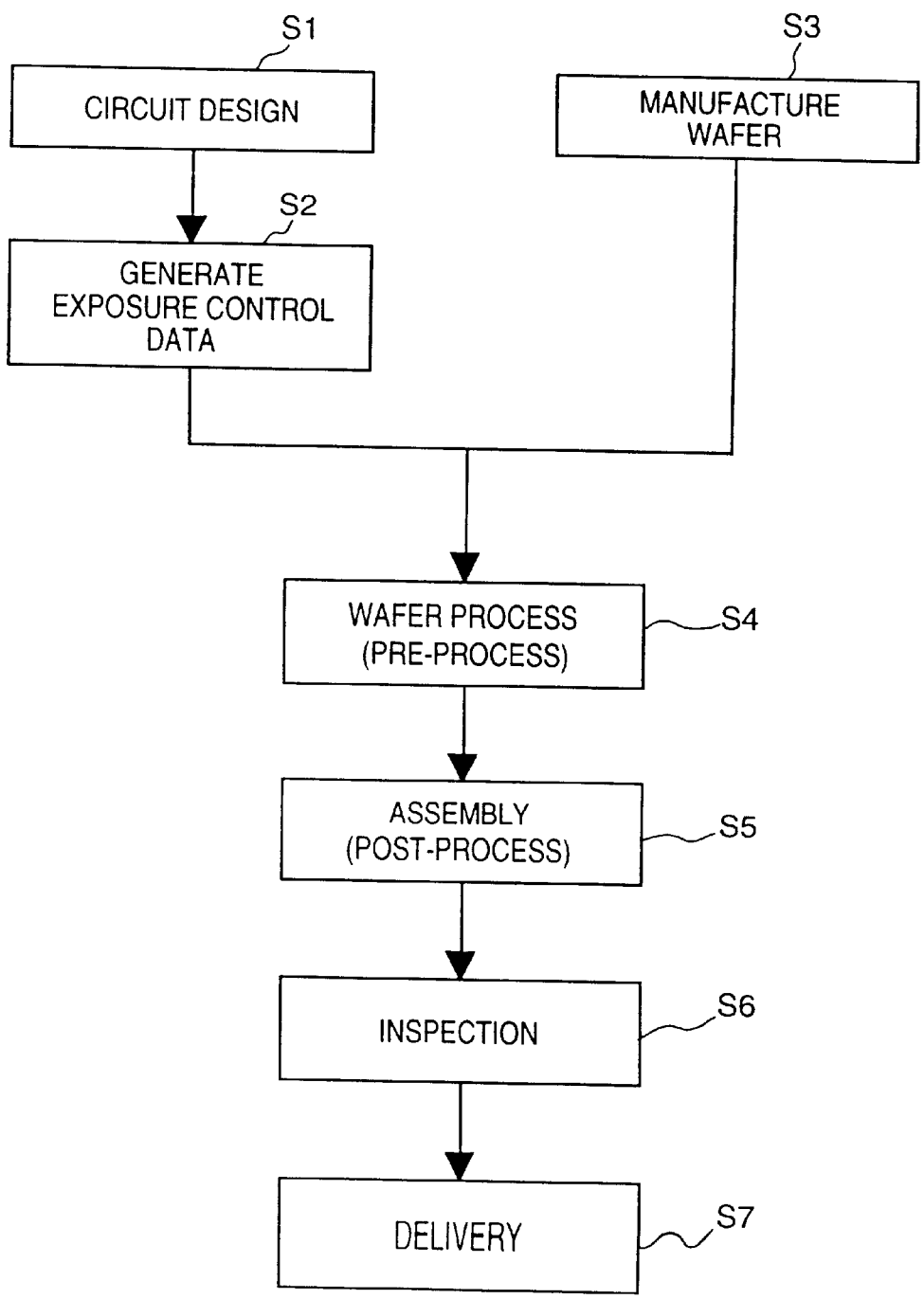
FIG. 13 is a flow chart for explaining the manufacturing flow of microdevices.
Figure 15A:
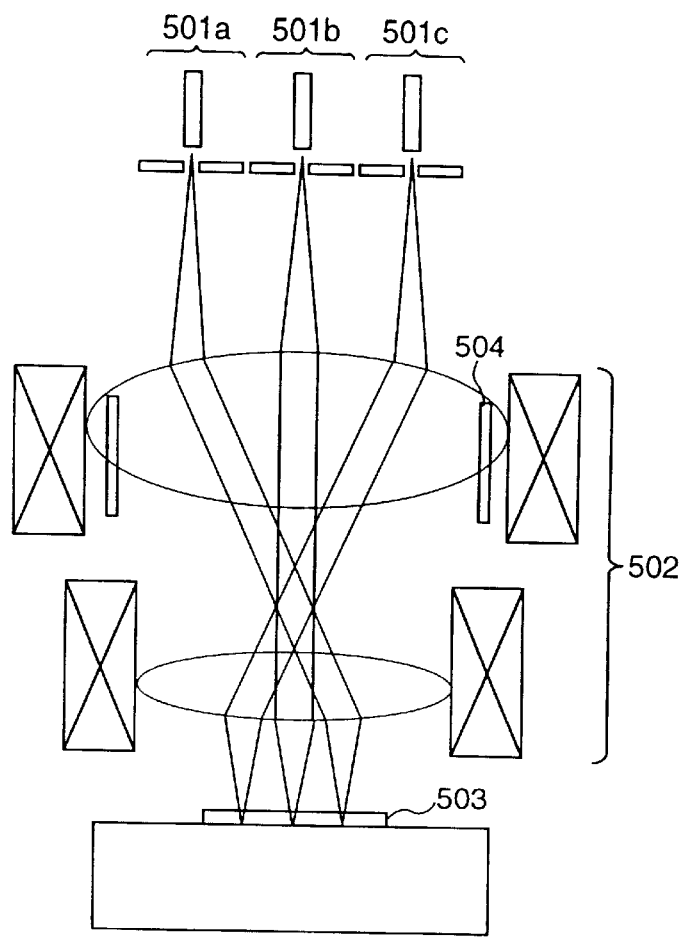
FIGS. 15A to 15D are views for explaining a conventional multi-electron beam type exposure apparatus.
Figure 15B:
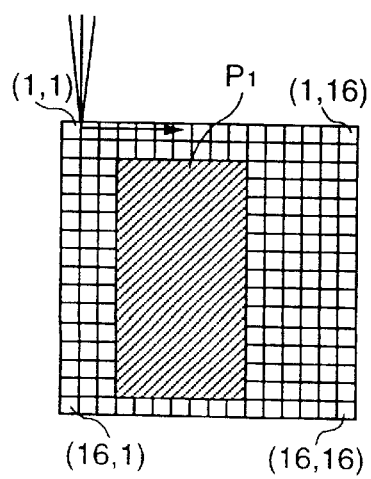
Figure 15C:
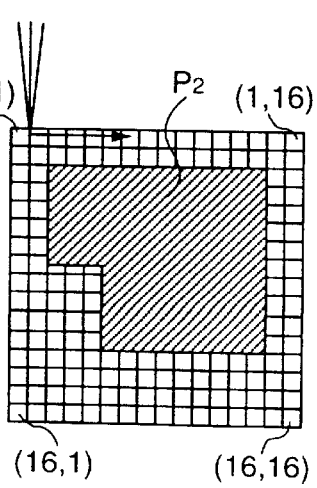
Figure 15D:
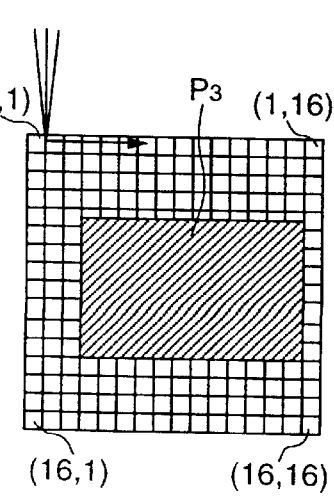

FIG. 13 shows the flow in the manufacture of a microdevice (e.g., semiconductor chips such as ICs, LSIs, liquid crystal devices, CCDs, thin film magnetic heads, micromachines, and the like). In step 1 (circuit design), the circuit design of a semiconductor device is done. In step 2 (generate exposure control data), the exposure control data of the exposure apparatus is generated based on the designed circuit pattern. Separately, in step 3 (manufacture wafer), a wafer is manufactured using materials such as silicon and the like. Step 4 (wafer process) is called a pre-process, and an actual circuit is formed by lithography on the wafer using the exposure apparatus input with the prepared exposure control data, and the manufactured wafer. The next step 5 (assembly) is called a post-process, in which semiconductor chips are assembled using the wafer obtained in step 4, and includes an assembly process (dicing, bonding), a packaging process (encapsulating chips), and the like. In step 6 (inspection), inspections such as operation tests, durability tests, and the like of semiconductor devices assembled in step 5 are conducted. Semiconductor devices are completed via these processes, and are delivered (step 7).

FIG. 14 shows the detailed flow of the wafer process. In step 11 (oxidation), the surface of the wafer is allowed to oxidize. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the above-mentioned exposure apparatus. In step 17 (development), the exposed wafer is developed. In step 18 (etching), a portion other than the developed resist image is removed by etching. In step 19 (remove resist), the resist film which has become unnecessary after the etching is removed. By repetitively executing these steps, multiple circuit patterns are formed on the wafer.

According to the manufacturing method of this embodiment, a highly integrated semiconductor device which is not easy to manufacture by the conventional method can be manufactured at low cost.

The present invention is not limited to the above embodiments and various changes and modifications can be made within the spirit and scope of the present invention. Therefore, to apprise the public of the scope of the present invention the following claims are made.

What is claimed is:

1. An electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes divided exposure fields obtained by dividing an exposure pattern in a moving direction of said stage while continuously moving the object to be exposed by said stage, comprising:

a deflection width adjustment unit for dynamically adjusting a minimum deflection width of said deflector in correspondence with the fields to be exposed of the exposure pattern; and a moving velocity adjustment unit for dynamically adjusting moving velocities of said stage in units of divided exposure fields in correspondence with exposure times required for exposing the respective divided exposure fields while deflecting the plurality of electron beams by said deflector.

2. The apparatus according to claim 1, wherein said moving velocity adjustment unit adjusts the moving velocities of said stage in units of divided exposure fields so as to make said stage move by a length of the corresponding divided exposure field in the moving direction of said stage within the exposure time of the divided exposure field.

3. The apparatus according to claim 1, wherein each of the divided exposure fields is made up of at least one unit exposure field formed by a matrix of a plurality of elementary exposure fields each of which is exposed by one electron beam, and said deflection width adjustment unit adjusts the minimum deflection width of said deflector in units of unit exposure fields.

4. The apparatus according to claim 3, wherein each of the divided exposure fields is made up of a matrix of a plurality of unit exposure fields in directions perpendicular to the moving direction of said stage.

5. The apparatus according to claim 3, wherein said deflection width adjustment unit adjusts the minimum deflection width of said deflector in units of unit exposure fields on the basis of a feature of an exposure pattern in the corresponding unit exposure region.

6. The apparatus according to claim 3, wherein said deflection width adjustment unit adjusts the minimum deflection width of said deflector in units of unit exposure fields on the basis of a minimum line width of an exposure pattern in the corresponding unit exposure region.

7. The apparatus according to claim 1, further comprising an adjustment unit for adjusting sizes of the electron beams on the object to be exposed in correspondence with the minimum deflection width of said deflector.

8. The apparatus according to claim 1, wherein the exposure time for each unit divided exposure field is determined on the basis of the number of times of settlement, a settling wait time, and a settling time of the electron beam in the corresponding divided exposure field.

9. The apparatus according to claim 1, wherein said moving velocity adjustment unit adjusts the moving velocities of said stages in units of divided exposure fields to fall within a range in which a difference between the moving velocity of said stage upon exposing one divided exposure field, and the moving velocity of said stage upon exposing the neighboring divided exposure field of the one divided exposure field becomes not more than a predetermined value.

10. An apparatus for generating exposure control data used for controlling an electron beam exposure apparatus of claim 1.

11. An electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes frames obtained by dividing an exposure pattern along a moving direction of said stage while continuously moving the object to be exposed by said stage, comprising:

a deflection width adjustment unit for dynamically adjusting a minimum deflection width of said deflector in correspondence with fields to be exposed of the exposure pattern; and a moving velocity adjustment unit for adjusting moving velocities of said stage in units of frames.

12. An apparatus for generating exposure control data used for controlling an electron beam exposure apparatus of claim 11.

13. A method of controlling an electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes divided exposure fields obtained by dividing an exposure pattern in a moving direction of said stage while continuously moving the object to be exposed by said stage, comprising:

the deflection width adjustment step of dynamically adjusting a minimum deflection width of said deflector in correspondence with the fields to be exposed of the exposure pattern; and the moving velocity adjustment step of dynamically adjusting moving velocities of said stage in units of divided exposure fields in correspondence with exposure times required for exposing the respective divided exposure fields while deflecting the plurality of electron beams by said deflector.

14. A method of controlling an electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes frames obtained by dividing an exposure pattern along a moving direction of said stage while continuously moving the object to be exposed by said stage, comprising:

the deflection width adjustment step of dynamically adjusting a minimum deflection width of said deflector in correspondence with fields to be exposed of the exposure pattern; and the moving velocity adjustment step of adjusting moving velocities of said stage in units of frames.

15. A method of generating exposure control data used for controlling an electron beam exposure apparatus, which has an electron beam source for generating a plurality of electron beams, a projection electron optical system for projecting images formed by the plurality of electron beams onto an object to be exposed, a deflector for deflecting the plurality of electron beams, and a stage for moving the object to be exposed, and which sequentially exposes divided exposure fields obtained by dividing an exposure pattern in a moving direction of said stage while continuously moving the object to be exposed by said stage, comprising the steps of:

dividing the exposure pattern into a plurality of blocks;

detecting features of exposure patterns in the blocks;

determining minimum deflection widths of said deflector in units of blocks on the basis of the features of the exposure patterns in the blocks;

calculating exposure times required for exposing individual divided exposure fields, each of which includes at least one block, while deflecting the plurality of electron beams by said deflector, on the basis of the minimum deflection widths and shapes of the exposure patterns pertaining to the respective blocks;

determining moving velocities of said stages in units of divided exposure fields in accordance with the calculated exposure times of the individual divided exposure fields; and generating exposure control data on the basis of the determined minimum deflection widths and moving velocities.

* * * * *

UNITED STATES PATENT AND TRADEMARK OFFICE
CERTIFICATE OF CORRECTION

PATENT NO. : 6,337,485 B1
DATED : January 8, 2002
INVENTOR(S) : Masato Muraki

It is certified that error appears in the above-identified patent and that said Letters Patent is hereby corrected as shown below:

Column 9,
Line 6, "an" should read -- a --.

Column 21,
Line 55, "beams'" should read -- beams --.

Column 23,
Line 9, "point-astigmatism" should read -- point astigmatism --.

Column 26,
Line 54, "perform" should read -- performs --.

Signed and Sealed this

Twenty-eighth Day of May, 2002

Attest:

JAMES E. ROGAN
Attesting Officer   Director of the United States Patent and Trademark Office